United States Patent
Yamamoto et al.

[11] Patent Number: 6,082,443
[45] Date of Patent: Jul. 4, 2000

[54] COOLING DEVICE WITH HEAT PIPE

[75] Inventors: Masaaki Yamamoto; Jun Niekawa; Tatuhiko Ueki; Masami Ikeda; Ken Sasaki, all of Tokyo, Japan

[73] Assignee: The Furukawa Electric Co., Ltd., Tokyo, Japan

[21] Appl. No.: 09/023,372

[22] Filed: Feb. 13, 1998

[30] Foreign Application Priority Data

| Feb. 13, 1997 | [JP] | Japan | 9-029003 |
| Mar. 20, 1997 | [JP] | Japan | 9-085808 |
| Apr. 11, 1997 | [JP] | Japan | 9-093823 |
| Jul. 23, 1997 | [JP] | Japan | 9-196259 |
| Sep. 29, 1997 | [JP] | Japan | 9-263586 |

[51] Int. Cl.[7] .................................. F28D 15/00
[52] U.S. Cl. .................. 165/104.26; 165/104.33; 165/104.21; 174/15.2; 361/704; 257/715
[58] Field of Search ............ 165/104.21, 104.26, 165/104.33; 257/715, 720; 361/700, 720; 174/15.2

[56] References Cited

U.S. PATENT DOCUMENTS

| 4,046,190 | 9/1977 | Marcus et al. | 165/104.26 |
| 4,047,198 | 9/1977 | Sekhon et al. | 357/82 |
| 4,461,343 | 7/1984 | Token et al. | 165/104.26 |
| 4,674,565 | 6/1987 | Beam | 165/104.26 |
| 4,697,205 | 9/1987 | Eastman | 165/10.26 |
| 4,715,430 | 12/1987 | Arnold et al. | 165/185 |
| 4,805,691 | 2/1989 | Cook et al. | 165/104.33 |
| 4,840,224 | 6/1989 | Dietzsch | 165/104.26 |
| 5,168,919 | 12/1992 | Berenholz et al. | 165/104.33 |
| 5,183,104 | 2/1993 | Novotny | 165/104.33 |
| 5,308,920 | 5/1994 | Itoh | 174/15.2 |
| 5,309,986 | 5/1994 | Itoh | 165/104.26 |
| 5,458,189 | 10/1995 | Larson et al. | 165/104.33 |
| 5,465,782 | 11/1995 | Sun et al. | 165/104.26 |
| 5,560,423 | 10/1996 | Larson et al. | 165/104.26 |
| 5,694,295 | 12/1997 | Mochizuki et al. | 165/80.3 |
| 5,713,413 | 2/1998 | Osakabe et al. | 165/104.33 |
| 5,727,619 | 3/1998 | Yao et al. | 165/104.33 |
| 5,769,154 | 6/1998 | Adkins et al. | 165/104.26 |

OTHER PUBLICATIONS

IBM Technical Disclosure Bulletin, R. J. Dombrowskas et al. p. 442, Jul. 1970.

*Primary Examiner*—Ira S. Lazarus
*Assistant Examiner*—Terrell McKinnon
*Attorney, Agent, or Firm*—Thorp Reed & Armstrong, LLP

[57] ABSTRACT

The invention provides a cooling device with a heat pipe, which is capable of effectively radiating heat from electronic equipment such as a small-sized computer. The cooling device with the heat pipe comprises a plate-like container made of heat transferring metal for containing a working fluid, and having a heat absorbing surface larger than that of the body to be cooled, a heat transferring metal column, and a hollow portion in which the working fluid exists. An alternating embodiment of the cooling device with the heat pipe comprises a plate-like container made of heat transferring metal, a heat absorbing wall having a large heat absorbing surface, and a plurality of protrusion portions.

20 Claims, 20 Drawing Sheets

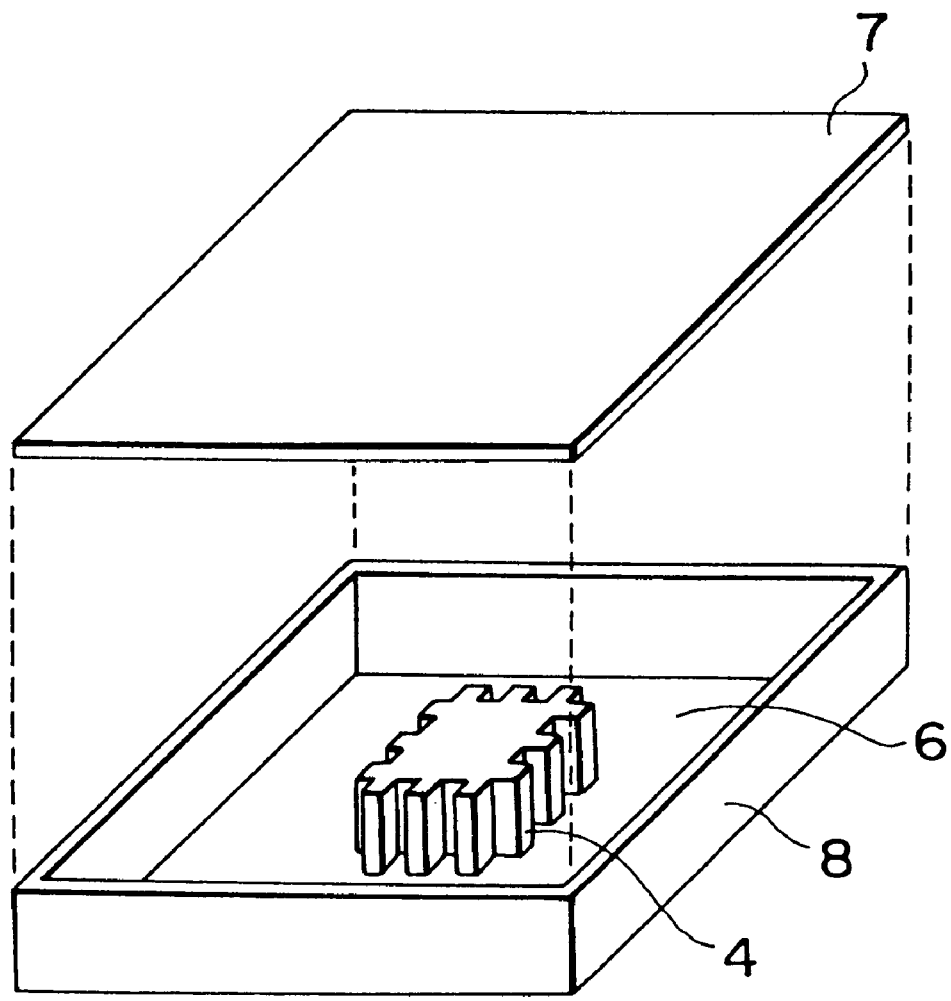

F I G. 16(a)
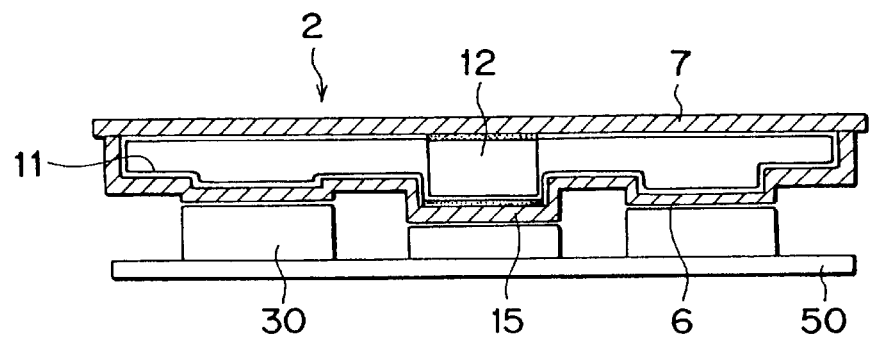
F I G. 16(b)
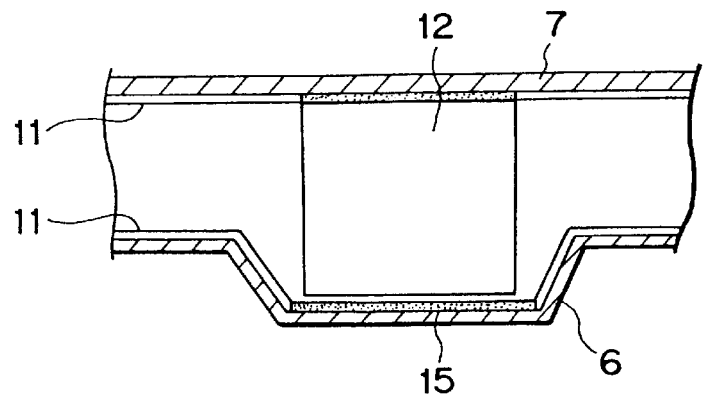
F I G 17
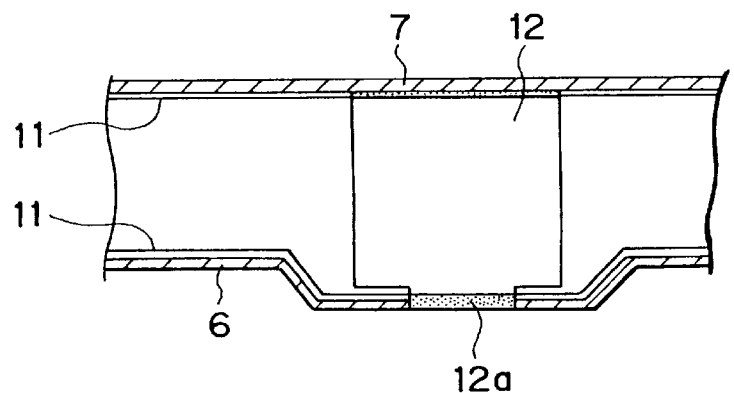

COOLING DEVICE WITH HEAT PIPE

BACKGROUND OF THE INVENTION

1. Field of the Invention

The invention relates to a cooling device used for preventing temperature from rising in electric parts such as small-sized computers and the like, which generate heat. In particular, the invention relates to a cooling device provided with a heat pipe.

2. Description of the Related Art

It is known to cool semiconductor devices and the like, mounted on various kinds of electrical equipment such as personal computers and other equipment, by air in a casing of the equipment, and by attaching a cooling body to a semiconductor device.

In the case of cooling the semiconductor device with a cooling body attached to the semiconductor device, there is often employed a manner of dispersing heat to a heat transferring body without directly attaching a radiating fin to the semiconductor device and radiating the heat through the fin directly attached to the heat transferring body because of the semiconductor device is generally small. The heat generated by the semiconductor device to be cooled is generally transmitted to the heat transferring body and radiated through the fins. The heat transferring body is frequently made of the material which has superior heat conductivity such as aluminum material and copper material.

The heat transferring body attached to the semiconductor device may be referred to as the heat spreader in view of a heat spreading. There is shown in FIG. 29 an example of the heat spreader using metal as a conventional heat transferring body. A semiconductor device 102 to be cooled is packaged on a printed circuit board 105. On an upper surface of the semiconductor 102 is disposed a heat spreader 100 which is a heat transferring body made of metal. The heat transmitted to the heat spreader 100 is radiated from fins 40.

In order to connect a body to be cooled, such as the semiconductor device 102, to the heat spreader in a heat transferring manner, both are in direct contact with each other, or connected through a heat transferring medium 110. For example, the heat transferring medium 110 is made of a heat transferring grease, thereby lowering the heat transferring resistance.

Moreover, the fins 40 may be attached to the heat spreader 100 in order to spread the heat more effectively. It is desired that the fins 40 be disposed in the vicinity of the outside of a casing of the equipment mounting the semiconductor device 102. Accordingly, the heat spreader 100 and the fins 40 may be away from each other depending on the location of the semiconductor device 102. In this case, the heat spreader 100 and the fins 40 can be connected through a heat pipe. The heat pipe transmits the heat as follows. The heat pipe receives, at an absorbing side thereof, the heat which is transmitted through the material of a container constituting the heat pipe, thereby causing the working fluid to be evaporated to allow the vapor to move to a heat radiation side of the heat pipe. The heat pipe cools the vapor of the working fluid at the heat radiation side thereof to return it to a liquid phase state again. Then the liquefied working fluid is moved to the heat absorbing side again. In this way, the circulation of the working fluid subjected to the phase change causes the heat to be transferred.

During the circulation of the working fluid, the vapor is moved due to gas diffusion, and then the liquid is moved due to gravity and the capillary phenomenon. Wicks may be employed in order to utilize the capillary phenomenon. In a case where the heat is transmitted through a heat transferring solid body such as metal, the transmission of the heat is caused due to the temperature difference. Accordingly, the larger the temperature difference, the larger the quantity of the transmitted heat, whereas in the case of the heat pipe, the larger the vaporization latent heat of the working liquid or the larger the circulation rate of the working fluid, the larger the quantity of transmitted heat.

As a result, the heat pipe is capable of transmitting plenty of heat even if the temperature difference is small, provided that the temperature of the heat absorbing side is higher than the vaporization temperature of the working fluid and that the temperature of the heat radiation side is lower than the vaporization temperature of the working fluid. Therefore, the heat pipe is effective in a case where the temperature of the body to be cooled is required to be lowered substantially to the room temperature. In many cases, heat pipes are employed as not only the connection between the conductive metal body and the fins but also as the heat spreader. And heat pipes are also employed with the heat transferring metal body.

There is shown in FIG. 30 a heat spreader in which a heat pipe is embedded in the heat transferring body. A heat pipe 109 is incorporated into a heat transferring metal body 108, thereby reducing the weight of the heat transferring metal body 108 by the amount that the heat transferring metal body 108 is replaced by the heat pipe 109. Although this heat pipe is thick and short in length, the construction thereof is the same as that of the usual heat pipe, so it may be called the plate-like flat heat pipe.

Recently, equipment including electronic products have been improved with respect to function and are made small-sized and light-weight by using electronic parts such as semiconductor devices, which require the temperature to be limited to room temperature. In such equipment, it is advantageous that instead of the heat transferring metal body, the heat pipe is employed as the heat spreader.

The heat pipe has a disadvantage in that the heat absorbing side of the heat pipe must be located below the heat radiation side because the liquefied working fluid flows downwardly. For the purpose of eliminating this disadvantage it is proposed that the liquefied working fluid is guided by means of wicks. The wick, which has a capillary function, moves liquid by surface tension. For example, Japanese Patent Provisional Publication (Kokai) No. 7-208884 proposed that a plate-like heat pipe having block-like wicks each formed by numerous capillaries tubes are arranged so as to contact with upper and lower surfaces of the heat pipe.

The above-mentioned proposal is shown in FIG. 31. FIG. 31(a) is a longitudinal sectional view of a container 200 containing working fluid, and FIG. 31(b) is a cross sectional view thereof. First wicks 201 are disposed between a heat radiating wall 202 and a heat absorbing wall 203, with a space 204 formed therearound, and then second wicks 205 are disposed along the heat radiation wall 202 and the heat absorbing wall 203. Then as shown in FIG. 31(b), there are a plurality of the first wicks 201, which are arranged radially.

The first wick 201, having a strong capillary force, is formed into a block, whereas the second wick 205, having a weak capillary force, comprises slightly rough metal wire mesh, each arranged horizontally, are stacked one over another. Reference numeral 210 designates an exothermic body. Even if the exothermic body 210 is located above the container 200, which is in the so-called top heat mode, the working fluid in the liquid phase condensed at the heat radiating wall 202 located below and is transferred to the heat absorbing wall 203 located above by means of the first wick 201. Then, the working fluid evaporates into a gas phase at the heat absorbing wall 203 and reaches the heat radiating wall 202 through the space 204 from the second wick 205 having a rough mesh.

However, in the field of the electronic products and the like, the bodies to be cooled are, in many cases, small in size and high in exothermic density like the semiconductor devices. In the above-mentioned heat pipe, the portion of the heat absorbing wall with which the exothermic body contacts is also contacted by working fluid in the liquid phase that is sealed in the mesh of the metal wire gauze, like the non-contacting portion.

The portion of the heat absorbing wall with which the exothermic body contacts has a higher temperature than the other positions. Accordingly, the temperature difference in the working fluid is large and hence the heat flow rate is high. As a result, the working fluid in the liquid phase cannot overtake the demand of the heat absorbing wall at the above contacting portion, which causes the evaporated working fluid to be excessively heated. Although the boiling limit means a state in which there is no working fluid in the liquid phase, when the temperature reaches the boiling limit, the heat of the heat absorbing surface can be transferred merely as sensible heat without being transferred as latent heat, which degrades the heat transferring efficiency.

According to the arrangement of the bodies to be cooled and the service condition of the electric equipment and the mounting of the bodies to be cooled, the bodies to be cooled are not necessarily arranged only on a horizontal surface. Accordingly, in the case of the portable equipments, they are arranged on an inclined surface. In such a state, the working fluid is prevented from being moved by gravity, which significantly lowers the heat transferring function of the heat pipe.

Moreover, as a result of reducing the size-of the equipment, a number of the bodies to be cooled are densely arranged in many cases requiring a number of cooling devices in narrow spaces in order to cool the equipment, which brings about the inconvenience of making the equipment further complicated. Under these circumstances it is desired that the cooling device be capable of dealing with semiconductor devices to be cooled having high exothermic density and capable of a variety of arrangements such as the inclined arrangement and the dense arrangement of the bodies to be cooled.

The invention has been made to solve the above problems, it is, therefore, an object of the invention to provide a cooling device which is capable of dealing effectively with a plurality of the bodies to be cooled densely arranged without significantly degrading the heat transferring efficiency even if the bodies to be cooled are high in exothermic density, and without significantly lowering the heat transferring function of the heat pipe even if the heat pipe is inclined.

SUMMARY OF THE INVENTION

To attain the above objective the first aspect of the invention provides a cooling device with a heat pipe comprising: a plate-like container made of heat transferring metal and containing working fluid and having a heat absorbing wall and a heat radiating wall wherein the heat absorbing wall has a heat absorbing surface larger than the surface contacting the body to be cooled; a heat transferring metal column having a section substantially identical in area with the contacting surface and being disposed between the heat absorbing wall and the heat radiating wall of the container; and a hollow portion in which the working fluid exists and being disposed around the heat transferring metal column.

According to the cooling device with the heat pipe, the heat pipe is used as the heat transferring body. The container made of heat transferring metal disposed in the heat pipe contains the working fluid and is provided with the heat transferring metal column between the heat absorbing wall and the heat radiating wall, and not only the wall of the container but also the heat transferring metal column acts as a heat transferring solid body. The heat transferring metal column has a section substantially identical in shape and in size with the surface of the heat pipe with which the body to be cooled contacts. The hollow portion is disposed around the heat transferring metal column, and the working fluid exists in the hollow portion.

According to the second aspect of the present invention, there is provided a cooling device with a heat pipe according to the first aspect of the invention, wherein the heat transferring metal column has a side surface formed with irregularities.

When the portion of the heat absorbing surface of the heat pipe in which the heat transferring metal column exists contacts the body to be cooled, the heat is first transferred to the heat absorbing wall and the heat transferring metal column, and then is transferred to the working fluid. When the heat transferring metal column has a side surface formed with irregularities, the contacting surface between the heat transferring metal column and the working fluid is made large, which makes it easy to transfer heat in large quantities.

According to the third aspect of the present invention, there is provided a cooling device with a heat pipe comprising: a plate-like container made of heat transferring metal for containing working fluid, and having a heat absorbing wall and a head radiating wall wherein the heat absorbing wall has a large heat absorbing surface corresponding to a plurality of bodies to be cooled; and a plurality of protrusion portions, each having a predetermined height and abutting with the bodies to be cooled and being disposed on the heat absorbing surface.

The cooling device efficiently cools a plurality of the arranged bodies to be cooled. The heat pipe is plate-like. The heat absorbing wall is provided with a plurality of protrusion portions which contact the corresponding respective bodies to be cooled. Because the respective bodies to be cooled are not necessarily identical in height with one another, the protrusion portions each have a predetermined height which is determined according to the distance between the heat absorbing surface of the container and the corresponding body to be cooled.

According to the fourth aspect of the present invention, there is provided a cooling device provided with a heat pipe according to the third aspect of the invention wherein a support is disposed inside of the container.

The working fluid in the container repeatedly changes phase between liquid phase and gas phase. Accordingly, the temperature changes cause the inner pressure of the container to change and brings about the deformation of the container. The support improves the pressure tightness of the container and prevents its deformation. In particular, when the height of the protrusion portions change, the heat transferring resistance between the protrusion portion and the body to be cooled is changes; accordingly, the deformation prevention is important.

According to the fifth aspect of the present invention, there is provided a cooling device with a heat pipe according to the fourth aspect of the invention, wherein the support is formed by subjecting the heat absorbing wall and/or the heat radiating wall of the container to embossing toward the opposed wall.

The support used for the above-mentioned embodiment of the present invention may be arranged by attaching the previously prepared support in the container. Further, because the container is plate-like, the distance between the heat absorbing wall and the heat radiating wall is small. Accordingly, the support can be formed by subjecting these walls to embossing inwardly. The embossing makes the production of the support easy.

According to the sixth aspect of the present invention, there is provided a cooling device with a heat pipe according to the third aspect of the invention, wherein mesh is disposed along an inner surface of the heat absorbing wall of the container.

Further, according to the seventh aspect of the present invention, there is provided a cooling device with a heat pipe according to the third aspect of the invention, wherein mesh is disposed along an inner surface of the heat absorbing wall and an inner surface of the heat radiating wall of the container.

In the container having the protrusion at the portion of the heat absorbing wall that contacts the body to be cooled, when the body to be cooled is arranged on the upper surface of the horizontal base, the liquefied working fluid returns inside of the protrusion portion by gravity. However, when the base is inclined, it does not necessarily return only by gravity. Placing the mesh along the heat absorbing wall enables the liquefied working fluid to be returned inside of the protrusion portion due to the capillary phenomenon even if the base is inclined.

Moreover, the mesh is placed along the inner surface of the heat radiating wall in addition to the mesh being placed along the inner surface of the heat absorbing wall, thereby ensuring the increase of the radiation area when the working fluid in the gas phase is condensed causing the condensation to be accelerated. This increases the circulation rate of the working fluid, which prevents the inner surface of the heat absorbing wall from being above the boiling point limit.

According to the eighth aspect of the present invention, there is provided a cooling device with a heat pipe according to the third aspect of the invention, wherein mesh is disposed inside of at least one of the protrusion portions of the container so as to face the heat radiating wall.

The mesh forms a number of capillaries and acts as a wick. In particular, to dispose the mesh on the protrusion portion which is high in heat transferring density causes the working fluid in the liquid phase to be permanently returned, resulting in the efficient heat transferring. Further, the mesh acts as the heat transferring solid body and transfers the heat from its wide surface to the working fluid, thereby resulting in the further improvement of heat transferring efficiency. It is preferred that the mesh is disposed on the protrusion portions as much as possible, or ideally on all the protrusion portions. The mesh should be disposed on at least one of the protrusion portions.

According to the ninth aspect of the present invention, there is provided a cooling device with a heat pipe according to the third aspect of the invention, wherein a heat transferring metal column is disposed inside of at least one of the protrusion portions of the container so as to face the heat radiating wall.

The heat transferring metal column is the support made of good heat transferring metal that prevents the container from being deformed, and is superior in heat transferring property as the heat transferring solid body. In particular, at the protrusion portion which is high in heat transferring density, disposing the heat transferring metal column in its protrusion portion causes the heat transfer area to the working fluid to be extended to cause the heat to disperse and transfer to the working fluid.

According to the tenth aspect of the invention, there is provided a cooling device with a heat pipe according to the ninth aspect of the invention, wherein the heat transferring metal column comprises a waveform fin.

The larger the surface area of the heat transferring metal column, the more efficiently the heat is transferred to the working fluid. If the heat transferring metal column comprises the waveform fin, the surface area greatly increases as compared to the heat transferring metal column being cylindrical or prism shaped. Therefore, it is preferred that the heat transferring metal column comprises the waveform fin.

According to the eleventh aspect of the present invention, there is provided a cooling device with a heat pipe according to the third aspect of the invention, wherein a block is disposed inside of at least one of the protrusion portions of the container.

According to the twelfth aspect of the present invention, there is provided a cooling device with a heat pipe according to the eleventh aspect of the invention, wherein the block contacts the heat absorbing wall through a metal mesh.

According to the thirteenth aspect of the present invention, there is provided a cooling device with a heat pipe according to the eleventh aspect of the invention, wherein protrusions are disposed on a surface of the block contacting the heat absorbing wall.

The block disposed inside the protrusion portion transfers the heat to the working fluid as the heat transferring solid body. If a narrow gap is formed between the block and the inner surface of the protrusion portion, the gap acts as capillaries, thereby making it easy to return the working fluid to the protrusion portion, which results in efficient heat transferring.

When the block contacts the heat absorbing wall through the metal mesh, the gap is formed between the block and the heat absorbing wall, thereby accelerating the returning of the working fluid. Moreover, when the protrusion portion is disposed on the end surface of the block contacting the heat absorbing wall joined to the heat absorbing wall, the gap is formed between the end surface of the block, except for the protrusion portion, and the heat absorbing wall.

According to the fourteenth aspect of the present invention, there is provided a cooling device with a heat pipe according to the ninth aspect of the present invention, wherein a porous metal body is disposed so as to contact the heat transferring column.

In the ninth aspect of the present invention the heat transferring metal column is disposed inside of the protrusion portion and the heat transferring to the working fluid is also carried through the surface of the heat transferring metal column. So long as the heat transferring metal column is arranged to contact the heat transferring metal column even if the container is in the inclined position, the liquefied working fluid easily returns to the surface of the heat transferring metal column through the capillaries of the heat transferring metal column, thereby preventing the boiling limit from being reached, which results in efficient heat transfer.

According to the fifteenth aspect of the present invention, there is provided a cooling device with the above-mentioned heat pipe of the third aspect of the invention, wherein an outer frame is fixed to an outer periphery portion of the container, and serves as a portion attached to a base of the body to be cooled.

According to the sixteenth aspect of the present invention, there is provided a cooling device with the above-mentioned heat pipe of the fifteenth aspect of the invention, wherein an attachment construction for the outer frame with the base of the body to be cooled is a screwing configuration.

According to the seventeenth aspect of the present invention, there is provided a cooling device with a heat pipe according to the fifteenth aspect of the invention, wherein a groove is disposed on the outer frame, and an edge portion of the container is fitted to the groove and then fixed to the outer frame.

According to the eighteenth aspect of the present invention, there is provided a cooling device with a heat pipe according to the fifteenth aspect of the invention, wherein the outer frame is electrically conductive.

According to the nineteenth aspect of the invention there is provided a cooling device provided with a heat pipe, wherein said heat pipe comprises a plate-like container made of a heat transferring metal for containing working fluid, having a heat absorbing wall and a heat radiating wall; a heat transferring metal column is disposed between said heat absorbing wall and said heat radiating wall; and a contact area of said heat absorbing wall with said heat transferring metal column covers an area of a body to be cooled which is to be contacted with said heat absorbing wall. The above heat absorbing wall can be a flat wall and also can be a wall provided with a plurality of protrusion portion.

According to the twentieth aspect of the invention there is provided a cooling device provided with a heat pipe as stated above, wherein a body to be cooled is contacted with a corresponding area where said heat transferring metal column is disposed on said heat absorbing wall.

According to the twenty-first aspect of the invention there is provided a cooling device provided with a heat pipe as stated above, wherein said heat absorbing wall is provided with a plurality of protrusion portion where said heat transferring metal column is disposed and a body to be cooled is contacted to a corresponding area of said heat absorbing wall where said protrusion portion is disposed.

According to the twenty-second aspect of the invention there is provided a cooling device provided with a heat pipe as stated above, wherein an area of said heat absorbing wall which a body to be cooled is contacted with is covered by said heat absorbing where said heat transferring metal column is disposed.

The reason the heat pipe comprises the plate-like container and the protrusion portions corresponding to a plurality of the bodies to be cooled is disposed on the heat absorbing surface is to effectively treat a case in which the bodies to be cooled are densely arranged, thereby disabling and ensuring a sufficient space to be around the respective bodies to be cooled, which makes it difficult to individually attach the cooling devices to the respective bodies to be cooled. However, to attach the plate-like container to the base so as to not cause strain during, the container must be fixed at a number of points.

Even in the case of the thin plate-like heat pipe, fixing the outer periphery of the container to the outer frame increases the stiffness, which causes all the protrusion portions to be abutted to the corresponding bodies to be cooled. The attaching of the outer frame at several points will suffice making the work easy even if the space is lacking. The screw attaching is easy and is capable of accurately carrying out the positioning in close contact with the protrusion portions to the bodies to be cooled with a suitable pressure.

The container may be fixed to the outer frame by screwing. When the outer frame is provided with a groove to which an edge portion of the container is fitted, all the periphery of the plate-like container is fixed by the outer frame, thereby preventing the container from being easily deformed, which results in reinforcement. Thus, the container becomes a stronger rigid body. Moreover, when the outer frame has a conductive property, it interrupts disturbance in the form of electromagnetic wave, resulting in the shield effect particularly in a case where the body to be cooled comprises the electric parts and the like.

BRIEF DESCRIPTION OF THE DRAWINGS

FIG. 3 is a perspective view of another heat pipe according to the present invention showing an assembly method thereof;

FIG. 16(a) is a sectional view of a container provided with a block according to the present invention; and FIG. 16(b) is an enlarged sectional view of the block attaching portion of the container;

FIG. 17 is a sectional view of a block according to the present invention;

FIG. 22 are perspective views of the porous metal body according to the present invention, which explains the material thereof, and in which

FIG. 27 are perspective views of a container of the present invention, in which

FIG. 28 are side views of a heat pipe for the example of the present invention, which shows the inclination of the heat pipe, in which

DETAILED DESCRIPTION OF THE PREFERRED EMBODIMENTS

The present invention will now be described in detail with reference to the drawings showing the respective embodiments. However, the following embodiments do not limit the present invention.

Figure 1:
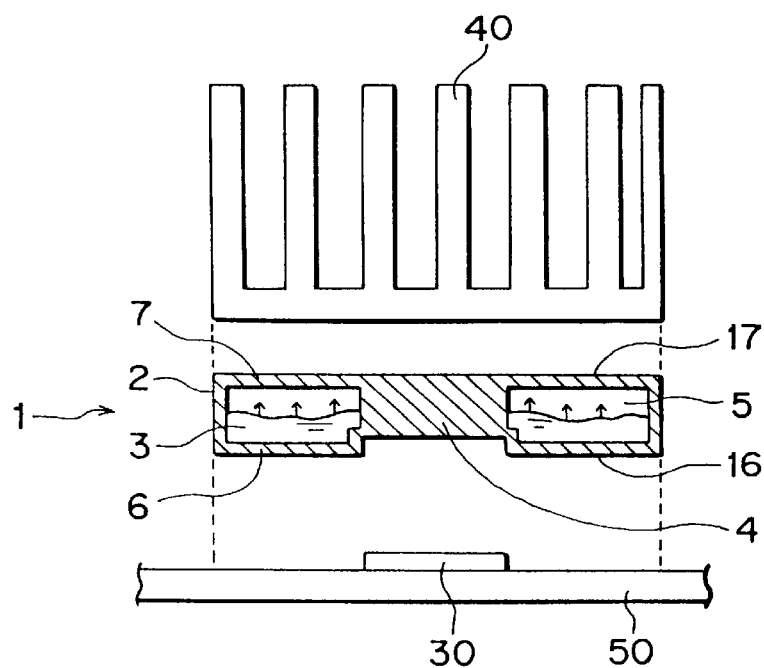
FIG. 1 is a sectional view of a heat pipe that explains a mode of a cooling device according to the present invention.

FIG. 1 shows a cooling device with a heat pipe according to the present invention, which describes a method of using the cooling device. A body 30 arranged on a base 50 is the object to be cooled. A heat pipe 1 comprises a container 2 and a working fluid 3. One wall of the container 2 contacts the body to be cooled 30 and constitutes a heat absorbing wall 6, an outer surface of which constitutes a heat absorbing surface 16, whereas the other wall of the container 2 constitutes a heat radiating wall 7, an outer surface of which constitutes a heat radiating surface 17. The heat radiating wall 7 is made of heat transferring metal and has therein a heat transferring metal column 4, and a hollow portion 5 around the heat transferring metal column 4.

A working fluid 3 exists in the hollow portion 5. The heat absorbing surface 16 is larger than the area of the heat absorbing wall 6 contacting the body to be cooled 30. The heat transferring metal column 4 has a sectional area which is substantially the same as the contacting area of the body to be cooled 30, and hence a lower end surface of the heat transferring metal column 4 constitutes a part of the heat absorbing surface 16.

The heat pipe 1 may be used independently as a cooling device, or may constitutes a cooling device in association with the fins 40 in order to increase the amount of radiation. The fins 40 are directly connected to the heat radiating surface 17, or connected through a heat transferring medium such as heat transferring grease (not shown). Further, the fins 40 may be integrally formed with the heat radiating surface 17. These components may be called the heat sink.

When the heat pipe 1 is used as a cooling device, the heat transferring medium also may be disposed between the heat absorbing surface 16 and the body to be cooled 30, thereby allowing a locally non-contacting portion between two contacting surfaces to be filled with the heat transferring medium, which substantially increases the contacting area to reduce the heat transferring resistance. The hollow portion 5 contains a predetermined amount of the working fluid 3. The hollow portion 5 is degassed once so as not to prevent the behavior of the working fluid 3, thereby causing other gasses to be discharged. The working fluid 3 includes water, and organic solvents such as substitute freon and alcohol. When vapor pressure of the working fluid becomes too large during the operation, the heat movement efficiency is decreased accordingly, taking into account the temperature of the heat absorbing surface and that of the heat radiating surface, the working fluid suitable thereto is selected.

In the heat pipe according to the invention, the heat of the body to be cooled 30 is transferred to the working fluid 3 through the heat absorbing wall 6 and the heat transferring metal column 4. If the heat transferring metal column 4 is not provided as is the case with the conventional heat pipe, the heat of the body to be cooled 30 is transferred to the working fluid 3 only through the heat absorbing wall 6. On this occasion, if the exothermic density of the body to be cooled 30 is high, only a portion of the heat absorbing wall 6 contacting the body to be cooled 30 temperature increases thereby causing this portion to be at the boiling limit.

The boiling limit means the temperature at which the liquid receives latent heat to be boiled and changed to gas such that the liquid is locally eliminated. In this condition, the transferred heat cannot be received as latent heat, which merely increases the temperature of the evaporated gas. The working fluid receives a large amount of the evaporation latent heat when evaporated, but the evaporated working fluid it does not have a large capacity to receive the heat, thereby increasing the temperature of the body to be cooled.

In other words, the existence of the working fluid in the liquid phase on the surface of the heat absorbing wall enables the latent heat to be absorbed from the heat absorbing wall, whereas the existence of the working fluid in the gas phase disables the heat to be absorbed to the same extent, thereby preventing the decrease in the temperature of the heat absorbing plate. Ideally, the working fluid of vaporized temperature is fed to the heat radiating plate to slightly lower the temperature of the working fluid, thereby causing the gas phase to be changed to the liquid phase, which results in the return of the working fluid. This causes the heat to be transferred at the highest efficiency. Therefore, if the temperature of the working fluid reaches the boiling limit or exceeds it, the heat transferring efficiency of the heat pipe is lowered.

To prevent the boiling limit from being reached one need only prevent the heat from concentrating on a portion of the heat absorbing plate which the body to be cooled contacts, and hence disperses the heat. As shown in FIG. 1, the existence of the heat transferring metal column 4 causes the heat to be transferred to the working fluid 3 through a side surface thereof and causes the heat from the body to be cooled 30 to be transferred with the dispersed heat.

Figure 2:
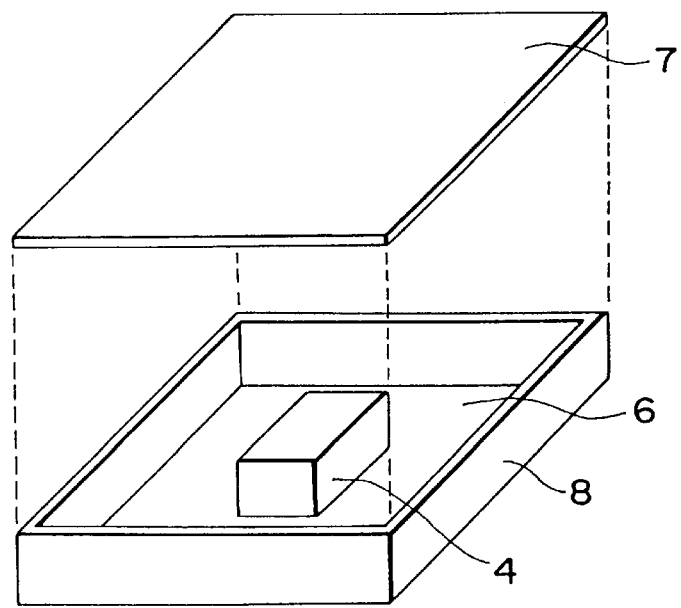
FIG. 2 is a perspective view of a heat pipe according to the present invention showing an assembly method thereof.

A method of assembling the above-mentioned heat pipe 1 will now be described with reference to FIG. 2. The container 2 is assembled by joining the heat transferring metal column 4 to a box comprising the heat absorbing wall 6, a side wall 8 joined to the heat absorbing wall 6, and the heat radiating wall 7 joined to the box. The joining method are preferably welding methods such as a MIG welding, a TIG welding, a resistance welding, and a blazing method. In the case of blazing, it is convenient to use a blazing sheet when the container 2 is made of aluminum, and a silver blazing method need only be used when dealing with copper.

It is preferred that the heat transferring metal used for the container 2 is made of metal having a high thermal conductivity, such as copper material and aluminum material. Tough pitch copper and oxygen free copper, which are pure copper systems, are particularly superior in thermal conductivity for the copper material, and pure aluminum system material is more superior in thermal conductivity than alloy material used for the aluminum material. However, when the strength is a particular requirement alloy system material can be used.

FIG. 3 shows anther embodiment of the heat pipe. A heat transferring metal column 4 has side surfaces formed with a number of grooves, thereby increasing its surface area. The increasing of the surface area causes the heat to be dispersed then transferred to the working fluid, thereby causing the heat transferring efficiency to be improved compared with that of a metal column having smooth side surfaces, which results in the improvement of the performance of the cooling device.

Based on the same principle, it is preferable to form irregularities on an inner surface of the container 2. The irregularities are formed by subjecting the inner surface to grooving or threading, or by separately preparing a sintered body and then joining it to the inner surface. In the case of a container having a thin wall, the irregularities may be formed by blasting granular metals.

For the purpose of the application to a plurality of the bodies to be cooled, it is recommended that the heat absorbing surface be enlarged and a plurality of the heat transferring metal columns be arranged thereon. On this occasion, when the cooling surfaces of the bodies to be cooled are on one plane, one plane surface will suffice for the heat absorbing surface. However, there is a case where the cooling surfaces of the bodies to be cooled are not necessarily on one plane because of different heights of the bodies to be cooled. In such a case, if the heat absorbing surface is flat, some of the bodies to be cooled cannot contact with the heat absorbing surface.

Figure 4A:
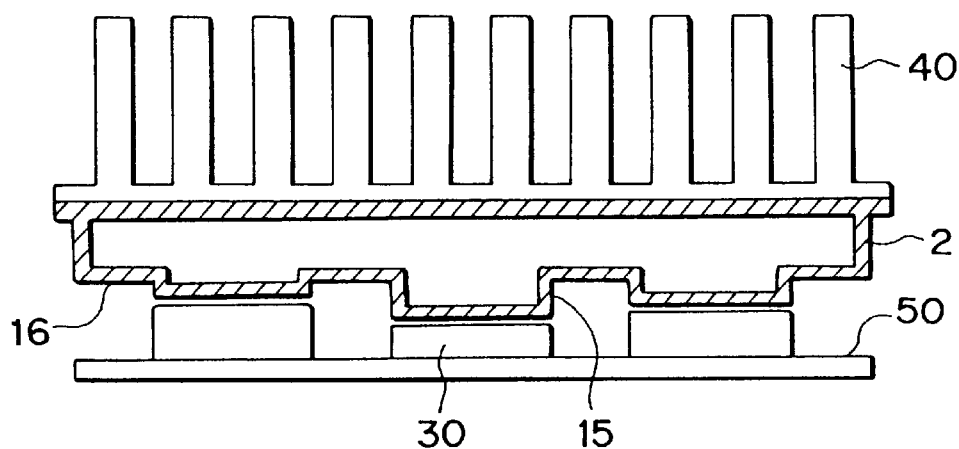
FIG. 4(a) is a sectional view of a heat pipe with a container having protrusion portions, according to the present invention.
Figure 4B:
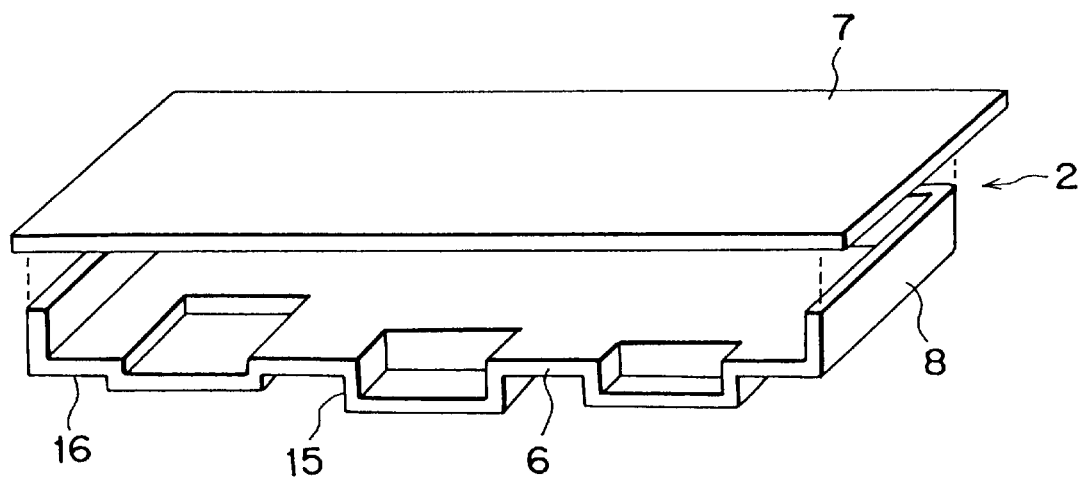
FIG. 4(b) is a perspective view thereof.

Therefore, to contact all the bodies to be cooled with the heat absorbing surface, the heat absorbing surface is provided with protrusion portions corresponding to the distances of the respective bodies to be cooled. There is shown a heat pipe with protrusion portions in FIG. 4, in which FIG. 4(a) is a partially sectional view of a container and the bodies to be cooled, and FIG. 4(b) is a perspective view of the container. The bodies to be cooled 30 are arranged on a base 50. These drawings show three elements to be cooled; however, the number is not limited thereto. The heights of these bodies to be cooled 30 are different from one another. A heat absorbing surface 16 of the container 2 is provided with protrusion portions 15 each having a height corresponding to that of the body to be cooled 30. Accordingly, even if the bodies to be cooled 30 have different heights from one another, all the bodies to be cooled 30 can be thermally contacted with one heat pipe.

Moreover, the bodies to be cooled 30 and the protrusion portions 15 may be in direct contact with each other, or contacted through a heat transferring sheet, a heat transferring grease, or the like. Further, they may be joined by soldering. Although they are not necessarily needed, fins 40 are recommended to improve the heat radiation rate within the limits of the space allowed. It is recommended that the fins 40 be forcedly air-cooled by a fan. There is shown in FIG. 4(b) a method of assembling the container 2. An under box comprises a heat absorbing wall 6 having the heat absorbing surface 16, protrusion portions 15, and a side wall 8 joined to the heat absorbing wall 6. The container 2 is then assembled by joining a heat radiating wall 7 to the under box. The inside of the container 2 is washed, injected with the working fluid, and then degassed, thereby providing the heat pipe. The degassing causes air remained in the container 2, carbon dioxide gas dissolving in the working fluid, and the like to be removed.

Figure 5:
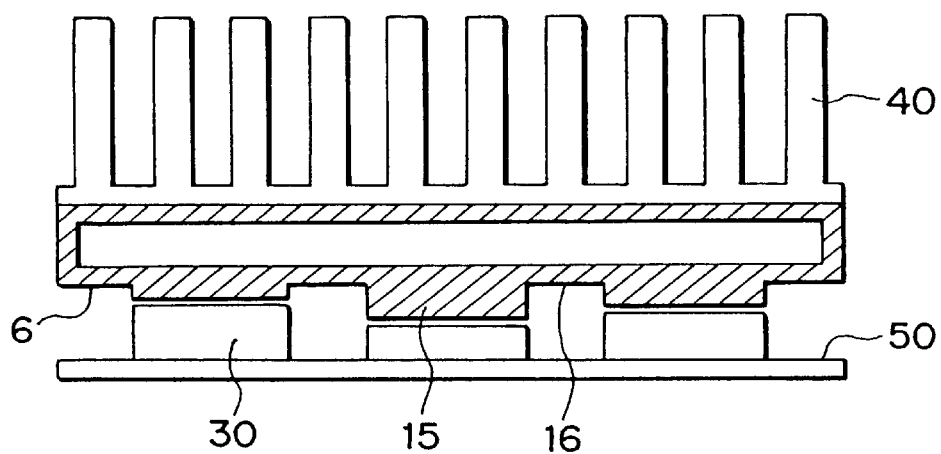
FIG. 5 is a sectional view of a heat pipe with another container having protrusion portions, according to the present invention.

There is shown in FIG. 5 a heat pipe with another container. Protrusion portions 15 of a heat absorbing surface 16 are adjusted in height by changing the thickness of the heat absorbing wall 6. The inner surface of the heat absorbing wall 6 is flat. The existence of recesses on the inner surface causes the mesh provided therein, referred to hereinafter, to be complicated, whereas the absence of recesses causes it to be simplified.

Figure 6:
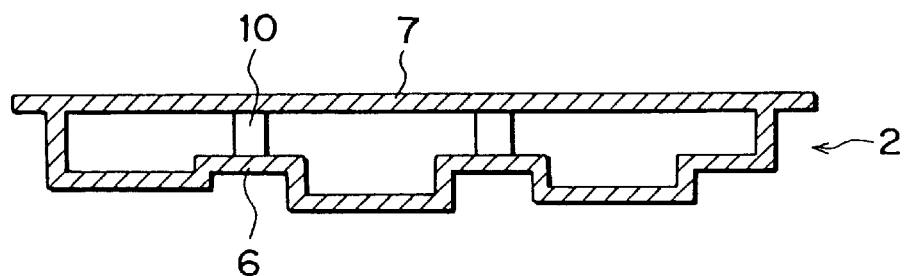
FIG. 6 is a sectional view of a container provided with supports, according to the present invention.

The inner pressure of the heat pipe is increased with the evaporation of the working fluid contained therein when operated. A plate-like heat pipe having a wide heat absorbing surface easily expands in the thickness-wise direction. Accordingly, to prevent the container of the plate-like heat pipe having the wide heat absorbing surface from being deformed, it is recommended that supports be provided. There is shown in FIG. 6 a container with supports. The supports 10 are joined to and extend between a heat absorbing wall 6 and a heat radiating wall 7 of a container 2, thereby preventing expansion. Although they are not necessarily disposed inside of the protrusion portions, the supports prevent the container from being deformed and acting as a solid heat transferring body, thereby increasing the heat transferring area to the working fluid and causing the heat from the body to be cooled to be dispersed. In particular, the supports disposed inside of the protrusion portions have a large dispersing effect. Moreover, these supports may be previously prepared, and then joined to the heat absorbing wall and the heat radiating wall; otherwise they may be prepared by subjecting the heat absorbing wall or the heat radiating wall to embossing.

Figure 7:
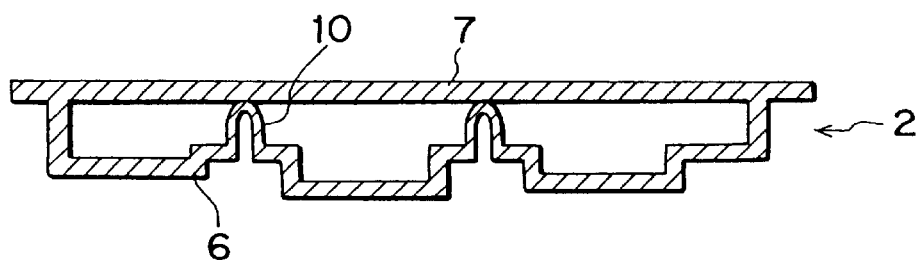
FIG. 7 is a sectional view of another container provided with supports, according to the present invention.

There is shown in FIG. 7 a container subjected to embossing. A heat absorbing wall 6 is subjected to embossing toward a heat radiating wall 7 and then the embossed leading ends contact the heat radiating wall 7, providing supports 10. The heat radiating wall 7 may be subjected to embossing and then the embossed leading ends may contact the heat absorbing wall 6. Otherwise, both walls may be subjected to embossing, and then the embossed leading ends may contact each other.

In order to prevent reaching the boiling limit, the heat is dispersed then transferred to the working fluid through the heat transferring metal column or the supports, as described above. Alternately, the boiling limit is prevented from being reached by plentifully feeding the working fluid in the liquid phase to the heat transferring portion. The capillary. phenomenon is employed to feed the working fluid in the liquid phase to the heat transferring portion.

Figure 8:
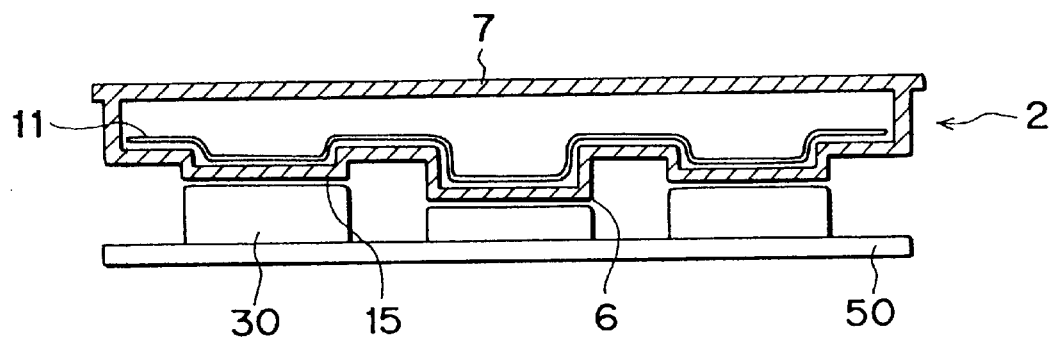
FIG. 8 is a sectional view of a container provided with mesh at an inner surface of a heat absorbing wall, according to the present invention.
Figure 9:
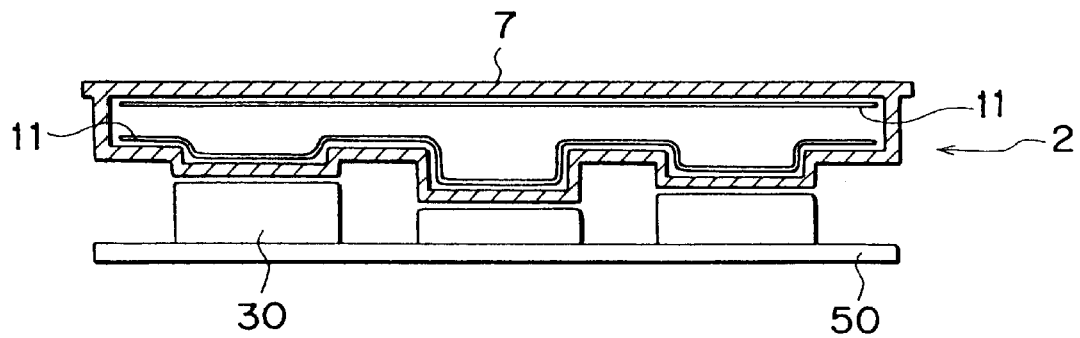
FIG. 9 is a sectional view of a container provided with mesh at an inner surface of a heat absorbing wall and an inner surface of a heat radiating wall, according to the present invention.

There is shown in FIG. 8 and FIG. 9 a container with mesh. In FIG. 8, mesh 11 is arranged along a heat absorbing wall 6. The mesh 11 comprises a net-like sheet, for uniformly feeding the working fluid in the liquid phase to the heat absorbing wall 6 including the insides of the protrusion portions 15 by the use of capillaries between the fibers. In FIG. 9, the mesh 11 is disposed along a heat radiating wall 7 in addition to the mesh 11 disposed along the heat absorbing wall 6. The mesh 11 disposed along the heat radiating wall 7 enlarges the radiation area of the working fluid in the gas phase, thereby bringing about the rapid condensation of the working fluid.

The mesh increases, in association with each other, the circulation rate of the working fluid to the heat absorbing wall 6, which results in the improvement of the heat transferring efficiency of the heat pipe. Moreover, the mesh 11 disposed along the heat absorbing wall 6 is preferably suitable to drawing or cutting so as to be arranged along the wall inside of the protrusion portions 15 whenever practicable. The mesh 11 along the heat radiating wall 7 is preferably joined to the heat radiating wall 7 by the use of resistance welding, and the like. Further, a sheet-like mesh may be bent into an arc so as to exhibit a resilient force by itself, thereby causing the mesh to be pressed to the heat radiating wall 7.

Figure 10:
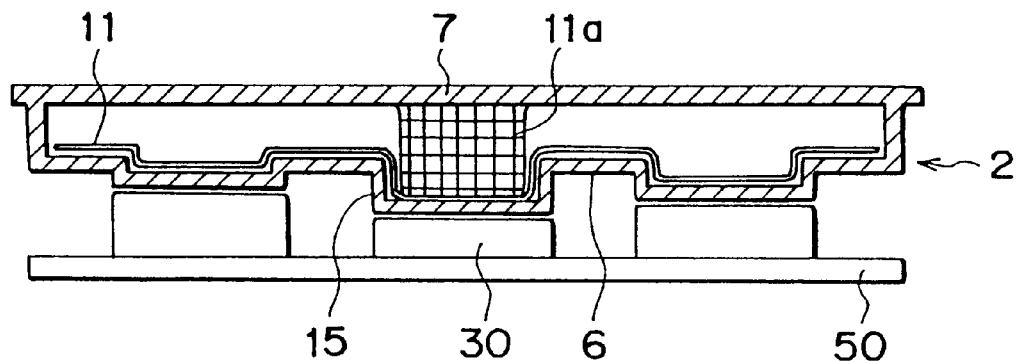
FIG. 10 is a sectional view of a container provided with mesh extending between a heat radiating wall and a heat absorbing wall, according to the present invention.
Figure 11:
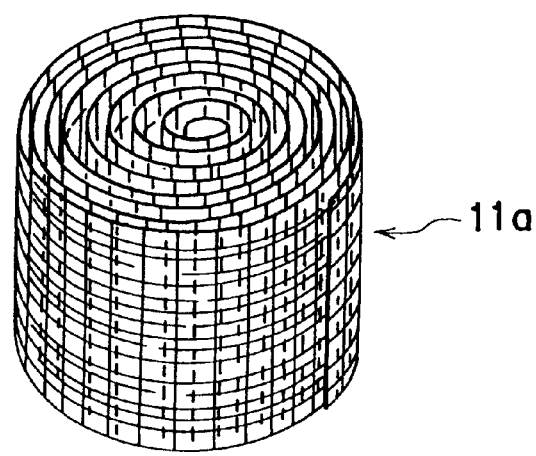
FIG. 11 is a perspective view of mesh arranged toward a heat radiating wall from a heat absorbing wall, according to the present invention.
Figure 12A:
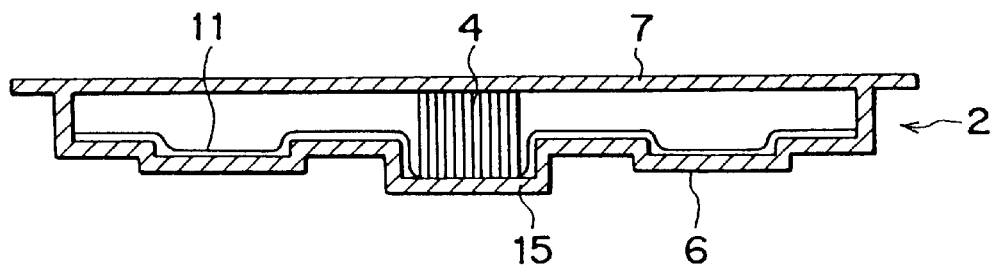
FIG. 12(a) is a sectional view of a container provided with a heat transferring metal column, which is enlarged in surface area, according to the present invention.
Figure 12B:
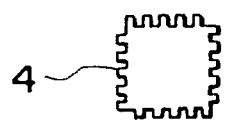
FIG. 12(b) is a plan view of the heat transferring metal column.

There is a construction wherein the mesh is arranged inside of the protrusion portion for dispersing and transferring the heat from the body to be cooled to the working fluid. This construction is shown in FIG. 10. In the container 2, a columnar mesh 11a is disposed inside of a protrusion portion 15 and joined to a heat absorbing wall 6 and a heat radiating wall 7. The columnar mesh 11a disperses the heat from the body to be cooled 30 over a wide surface then transfers it to the working fluid. Further, the capillary construction can feed the working fluid in the liquid phase to the inside of the protrusion portion in a case where the heat pipe is in a complete top heat mode. In the drawing, the mesh 11 is disposed along the heat absorbing wall 6 in addition to the columnar mesh 11a. The mesh 11 feeds the working fluid in the liquid phase to the columnar mesh 11a, so that the joint use of the mesh 11, and columnar mesh 11a is more effective, which is heightened particularly when the heat pipe is inclined. Moreover, the columnar mesh 11a can be formed by rolling a sheet-like mesh into a vortex as shown in FIG. 11. It is preferred that the columnar mesh 11a is arranged inside of a number of the protrusion portions 15 as much as possible. Even if it is impossible, the columnar mesh 11a is preferably arranged only inside of the protrusion portions 15 contacting the bodies to be cooled 30 which generate a particularly large amount of heat, and hence increases the heat flow rate. When there is only one columnar mesh 11a, it is recommended to arrange it on the inside of the protrusion portion 15 having the greatest heat flow rate. As described above, among the elements dispersing the heat from the body to be cooled to the working fluid is a heat transferring metal column. The arrangement of this heat transferring metal column inside of the protrusion portion causes the heat from the body to be cooled to be dispersed, thereby naturally increasing the heat transferring efficiency. In particular, the heat transferring metal column having a large surface area has a marked effect. There is shown in FIG. 12 a container in which a heat transferring metal column is inside of a protrusion portion. FIG. 12(a) is a sectional view of the container. A heat transferring metal column 4 is disposed inside of the protrusion portion 15, and joined to the heat absorbing wall 6 and the heat radiating wall 7. Moreover, in FIG. 12(a), mesh 11 is arranged along the heat absorbing wall 6. Although the heat transferring metal column 4 can take many configurations, one example of a section is shown in FIG. 12(b). The heat transferring metal column 4 has a side surface formed with irregularities, thereby increasing the surface area to several times than that of a metal column having a cylindrical section, which causes the heat to be dispersed and transferred to the working fluid. Moreover, the heat transferring metal column 4 can be joined to the heat absorbing wall 6 or the heat radiating wall 7 without causing resistance to the heat transfer, providing that the joint is created by blazing, welding, and the like.

Figure 13:
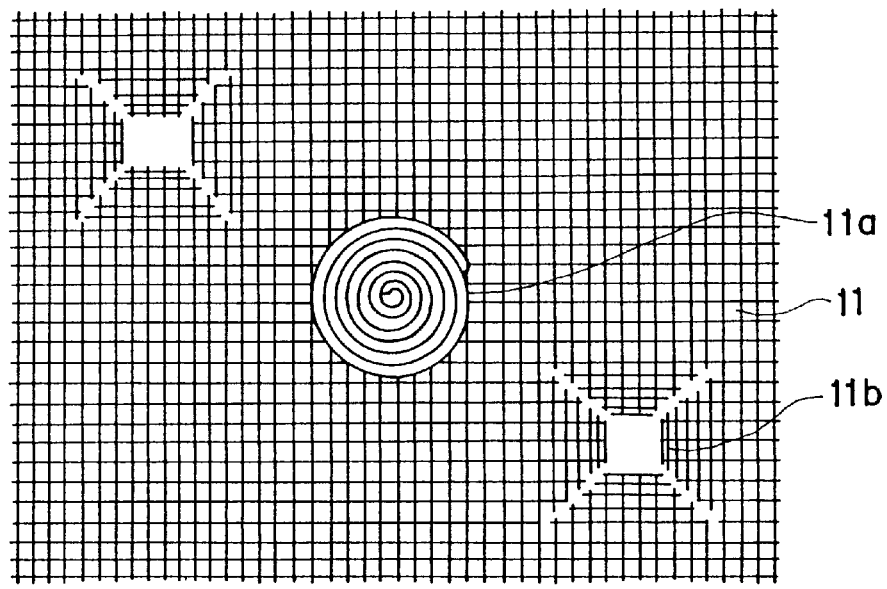
FIG. 13 is a plan view of the mesh according to the present invention.

Moreover, as shown in FIG. 10 and FIG. 12, in a case where the columnar mesh 11a or the heat transferring metal column 4, is used with the sheet-like mesh 11, it is preferred that the mesh 11a be subjected to cutting and combined with the columnar mesh 11a and the metal column that is being used. An example of this configuration is shown in FIG. 13. A portion of the mesh 11 which is combined with the columnar mesh 11a is cut off, where the cut portions are connected to each other through the capillaries.

Reference numeral 11b designates a portion of the mesh 11 which is to be combined with the heat transferring metal column, where the mesh 11 has a small rectangular opening having oblique cuts at it corners. The cut portions are then positioned vertically with respect to the sheet surface of the mesh 11 and contact with a side surface of the heat transferring metal column. Moreover, although not illustrated, a portion arranged along the inside of the protrusion portion is preferably subject to drawing according to the geometry of the inside of the protrusion portion such that the mesh will contact the protusion portion.

Figure 14A:
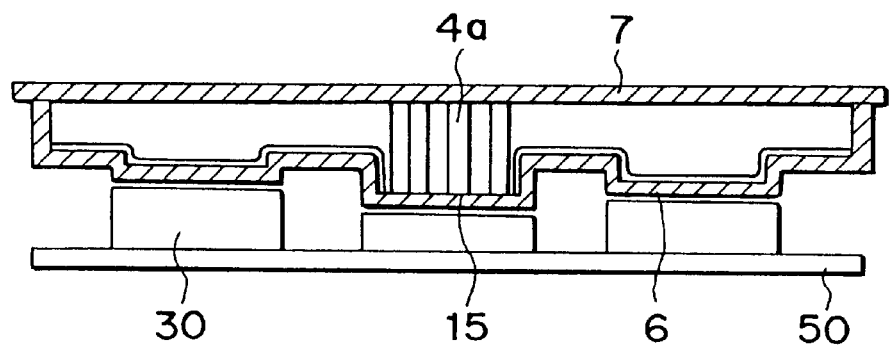
FIG. 14(a) is a sectional view of a container provided with a waveform fin according to the present invention.
Figure 14B:
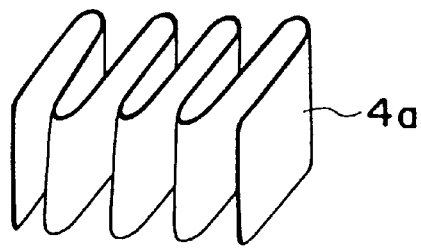
FIG. 14(b) is a perspective view of the waveform fin.

When the heat transferring metal column comprises a waveform fin, its surface area is further increased. There is shown in FIG. 14 a container with a waveform fin, in which FIG. 14(a) is a longitudinal sectional view of the container. Reference numeral 4a designates a waveform fin, which is disposed inside of the protrusion portion 15 and joined to a heat absorbing wall 6 and a heat radiating wall 7. FIG. 14(b) is a perspective view of the waveform fin 4a that is a heat transferring metal plate bent in a zigzag manner.

Figure 15:
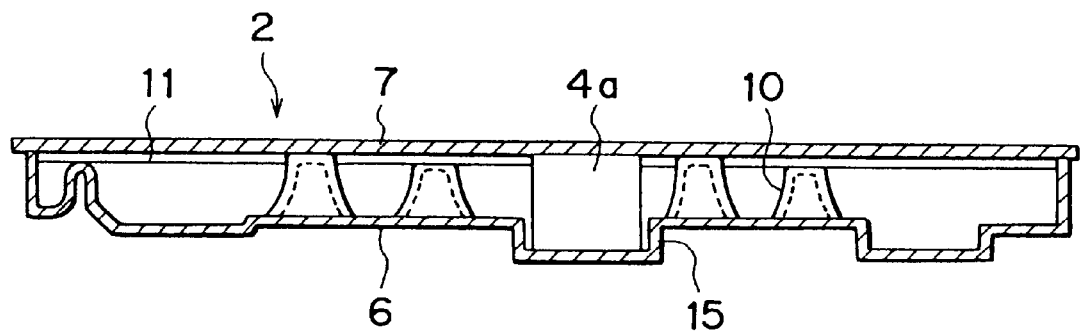
FIG. 15 is a sectional view of a container provided with a waveform fin and supports according to the present invention.

When the heat transferring metal column constituting the waveform fin is thin, it may fail to sufficiently function as a support. If this is the case, the waveform fin and the support may be jointly used. FIG. 15 illustrates a container in which a waveform fin and a support are jointly used. The waveform fin 4a is disposed inside of the protrusion portion 15, otherwise the supports 10 are provided therein. The support 10, of course, serves to disperse and transfer the heat of a heat absorbing wall 6 to the working fluid.

A block will be described, for positively introducing the working fluid in the liquid phase into the inside of protrusion portion and then dispersing and transferring the heat to the working fluid by itself. There is shown in FIG. 16 a container with the above-mentioned block. FIG. 16(a) is a longitudinal sectional view of a container 2, in which a block 12 is disposed inside of a protrusion portion 15. FIG. 16(b) is an enlarged view of the portion of the container in the vicinity of the block 12. The block 12 is brazed with the heat radiating wall 7 through mesh 11, whereas the block 12 is not joined with the heat absorbing wall 6, wherein mesh 11 extends therebetween. This mesh 11, in association with the mesh 11 extended all over in the container 2, serve as the capillaries to thereby introduce, even if the heat pipe is inclined, the working fluid in the liquid phase to the inside of the protrusion portion 15 which prevents the shortage of the working fluid in the liquid phase at this location which has a large heat transfer. However, in this case, the block 12 poorly functions as a support; accordingly, a support may be separately provided.

FIG. 17 is a view showing another embodiment of the block. The block 12 has a low protrusion 12a at a heat absorbing wall-side end surface thereof, which protrusion 12a is joined to the heat absorbing wall 6. The block 12 is brazed with the heat radiating wall 7 at a heat radiating wall-side end surface thereof with a part of the mesh 11 therebetween. Between the block 12 and the heat absorbing wall 6, except for the portion of the protrusion 12a, a gap is formed and the working fluid in the liquid phase is introduced.

Although not illustrated, a plurality of the protrusions 12a, may be provided. Further, because the protrusion 12a is joined to the heat absorbing wall, the block 12 sufficiently serves as a support, and one made of transferring metal sufficiently serves as a heat transferring metal column.

Figure 18A:
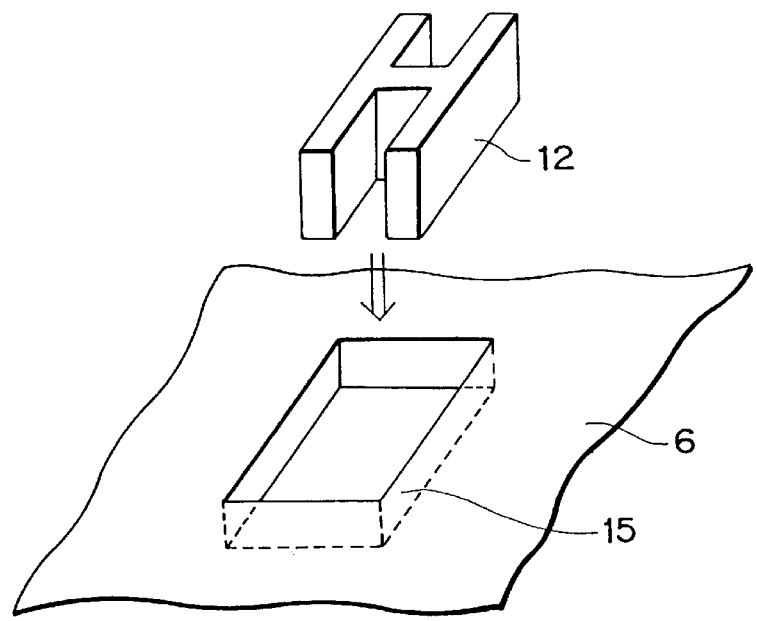
FIG. 18 is a perspective view of a block which is increased in surface area, according to the present invention.
Figure 18B:
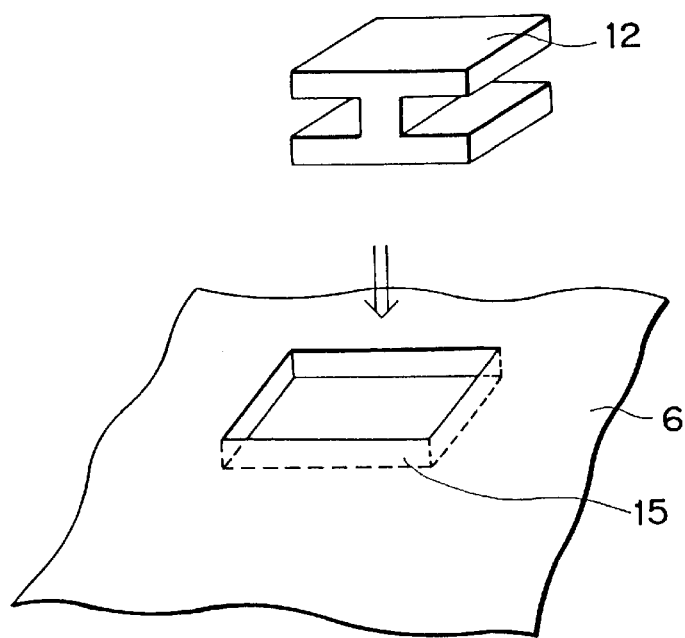

It is preferable, in view of the increase of the surface area and the weight reduction, to use the block having a surface formed with irregularities. Such a block is shown in FIG. 18. The block 12 shown in FIG. 18(a) has a longitudinal direction-wise recess portion, whereas the block 12 shown in FIG. 18(b) has a transverse direction-wise recess portion. It goes without saying that although not illustrated, a plurality of the recess portions may be provided.

The embodiment described above of the heat pipe introduces the working fluid in the liquid phase to the inside of the protrusion portion contacting the body to be cooled by the use of the capillaries between the mesh and the gap, which disperses and transfers the heat by the arranged heat transferring metal column and block, thereby keeping the temperature below the boiling limit. Moreover, there has been described that even when the heat pipe is used in the inclined state or in the upside down state, the provision of the mesh causes the working fluid in the liquid phase to be introduced to the inside of the protrusion portion. An embodiment of the heat pipe which describes this inclination will be described hereinafter.

Figure 19:
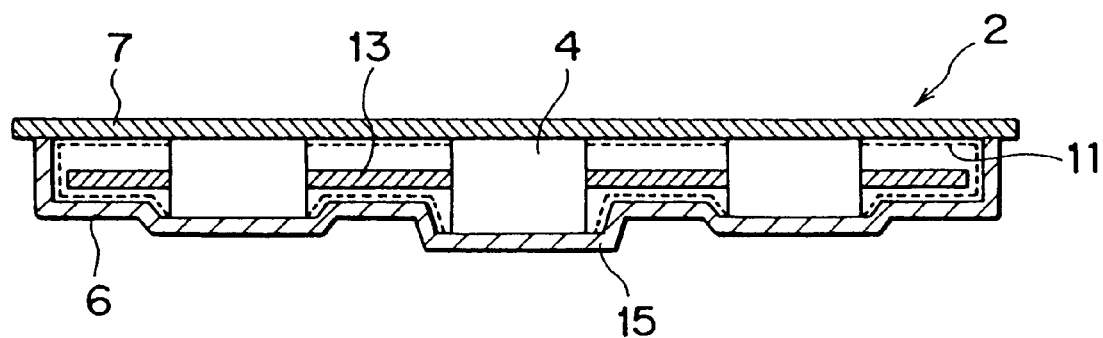
FIG. 19 is a sectional view of a container provided with porous metal bodies according to the present invention.

There is shown in FIG. 19 a container in which porous metal bodies are arranged so as to contact with heat transferring metal columns. In three of the protrusion portions 15 are disposed heat transferring metal columns 4 which contact porous metal bodies 13. The porous metal body 13, formed of an assembly of capillaries to which numerous pores are connected, feeds, when the working fluid of liquid is evaporated at the surface of the heat transferring metal column 4, a new working fluid in the liquid phase thereto. The porous metal body 13 may have a plate-like, a bar-like, a cylindrical-like shape, or another shape, and may be attached in such a manner that a part of, or all of the body contacts with the working fluid regardless of the position of the container 2.

Figure 20:
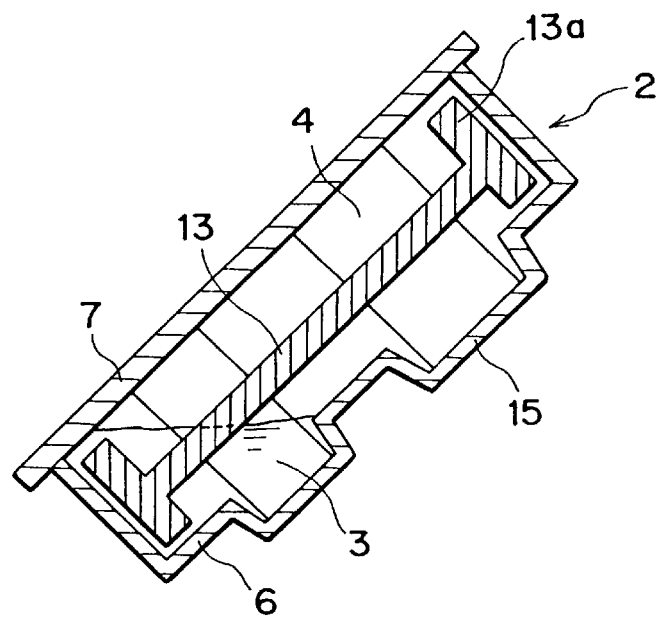
FIG. 20 is a sectional view of a container in an inclined position according to the invention, which explains the relationship between working fluid and a porous metal body.

FIG. 20 shows an inclined container 2. The working fluid 3 in the liquid phase hardly contacts a heat transferring metal column 4 on the right-hand side of FIG. 20 by the gravity. Most of the working fluid 3 returns through the capillaries of a porous metal body 13. The other of the working fluid 3 returns by the capillaries of a mesh (not shown) arranged along the heat absorbing wall 6 or the heat radiating wall 7. Because the mesh is poor in stiffness, the mesh is connected to the wall, and the like; however, the porous metal body can be held in shape by itself, thereby easily causing it to be disposed in the space. The porous metal body can also be formed by putting a fine metal mesh of thin fibers one over another and hence providing the stiffness to the metal mesh.

Figure 21:
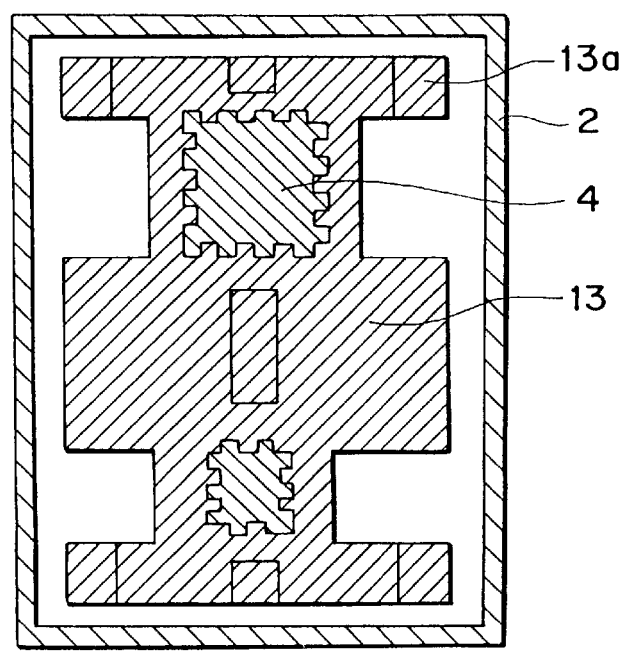
FIG. 21 is a sectional view of the container according to the present invention, which explains the shape of the porous metal body.

FIG. 21 is a transverse sectional view of the container provided with the porous metal body. The porous metal body 13 is shaped like a flat plate having vertical blades 13a at upper and lower portions thereof like a substantial cross. A part of the porous metal body 13 or the heat transferring metal column 4 contacting the working fluid 3 in the rotation position with the vertical axis of the drawing rotated at any angle.

Moreover, the porous metal body 13 may contact the inner surface of the container 2; however, a space for vapor flow is required between the heat absorbing wall and the heat radiating wall. The reason the porous metal body 13 is shaped in a slightly complicated form, as shown in FIG. 20 and FIG. 21, is to ensure the above space. Also, to use the mesh arranged along the inner surface of the container wall further results in the ensured return of the working fluid.

The porous metal body may be formed by putting the metal mesh one over another, rolling up the one, or bundling the metal-made woven or unwoven, or the like, and then subjecting them to pressing, or the like if necessary. Otherwise, the porous metal body includes the one formed by sintering metal powder, electrodepositing metal into a porous body, precision casting, plating metal on a cell-like porous resin body and then removing the resin, and removing one phase of the two phase alloys by the use of acid, or electrodialysis and the like. Moreover, it is preferred that the void ratio of the porous metal body is substantially not less than 20%.

Figure 22A:
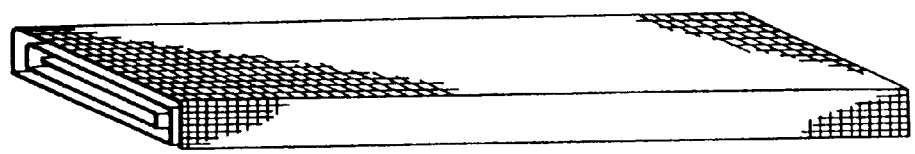
FIG. 22(a) is a metal woven molded body.
Figure 22B:
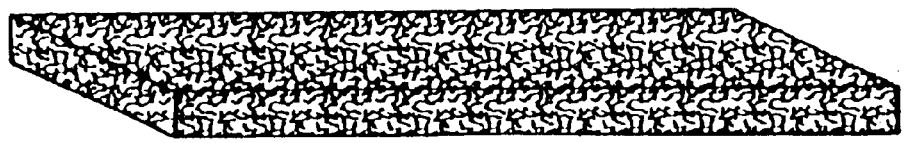
FIG. 22(b) is a metal unwoven molded body.
Figure 22C:
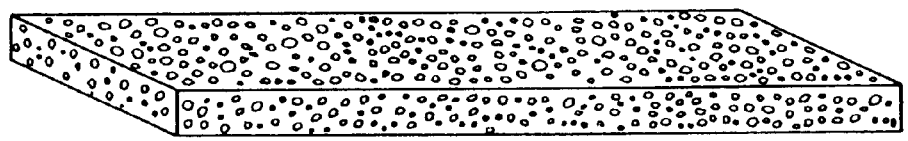
FIG. 22(c) is a cell-like porous metal body.

FIG. 22 shows an example of the porous metal body, in which FIG. 22(a) is the woven metal molded body formed by weaving metal cloth, FIG. 22(b) is the unwoven metal molded body, and FIG. 22(c) is a cell-like porous metal body. When metal cloths or meshes are formed, it is recommended that the fiber diameter range from 0.03 to 0.3 mm and that the mesh range from #30 (i.e., 20 mesh/inch) to #200 (i.e., 200 mesh/inch).

As described above, the embodiment of the plate-like container have the protrusion portions. When the heat pipe provided with the above container is mounted, the protrusion portion must be positioned at the body to be cooled, and then the attaching operation can be performed easily with both contacting each other, but without adding an excessive load to the body to be cooled. To satisfy all the above condition, the outer frame is provided, and then the container and the fins are fixed to the outer frame.

Figure 23:
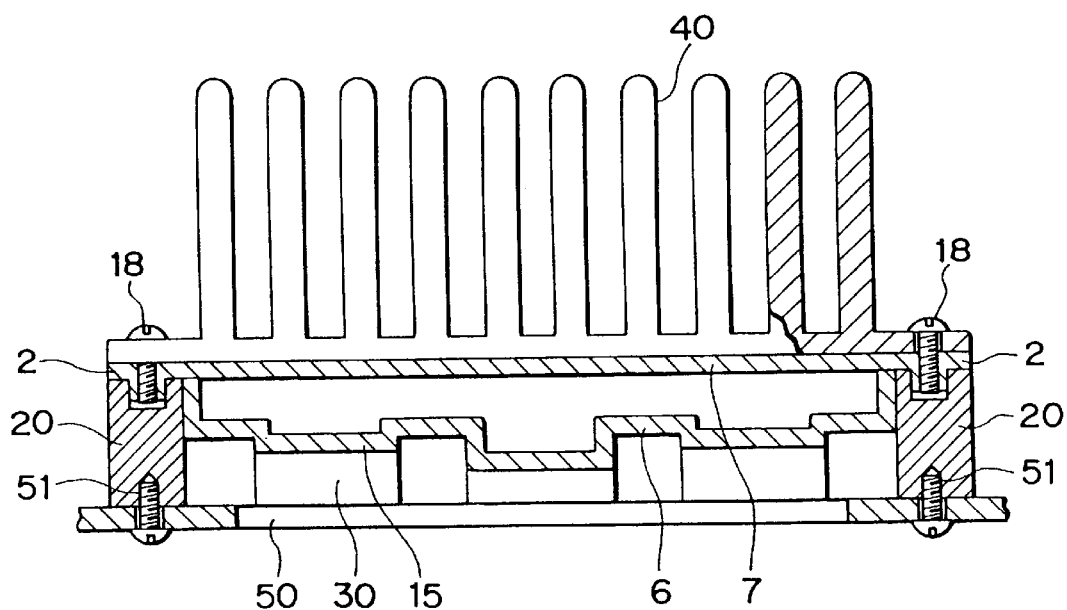
FIG. 23 is a sectional view of a heat pipe with an outer frame according to the present invention.

FIG. 23 is a partial sectional view which is helpful in explaining a construction of mounting a heat pipe and a base. Reference numeral 20 designates an outer frame to which a container 2 and fins 40 are fixed by screws 18. The container 2 is fixed to the outer frame 20, thereby making it difficult to deflect the container 2 if it is made of thin plates, which enables the heat pipe to be attached such that the protrusion portion 15 and the body to be cooled 30 contact each other, but without adding an excessive load to the body to be cooled.

The outer frame 20 is separately provided with threaded holes 51 by which the outer frame 20 is screwed to the base 50. Positioning the screws causes the positions of the protrusion portion 15 and the base 50 to coincided, and perfectly tightening the screws causes both to be closely contacted by a suitable force. In most cases, the outer frame 20 is attached to the base 50 at four corners, which makes the attaching operation easy.

Figure 24:
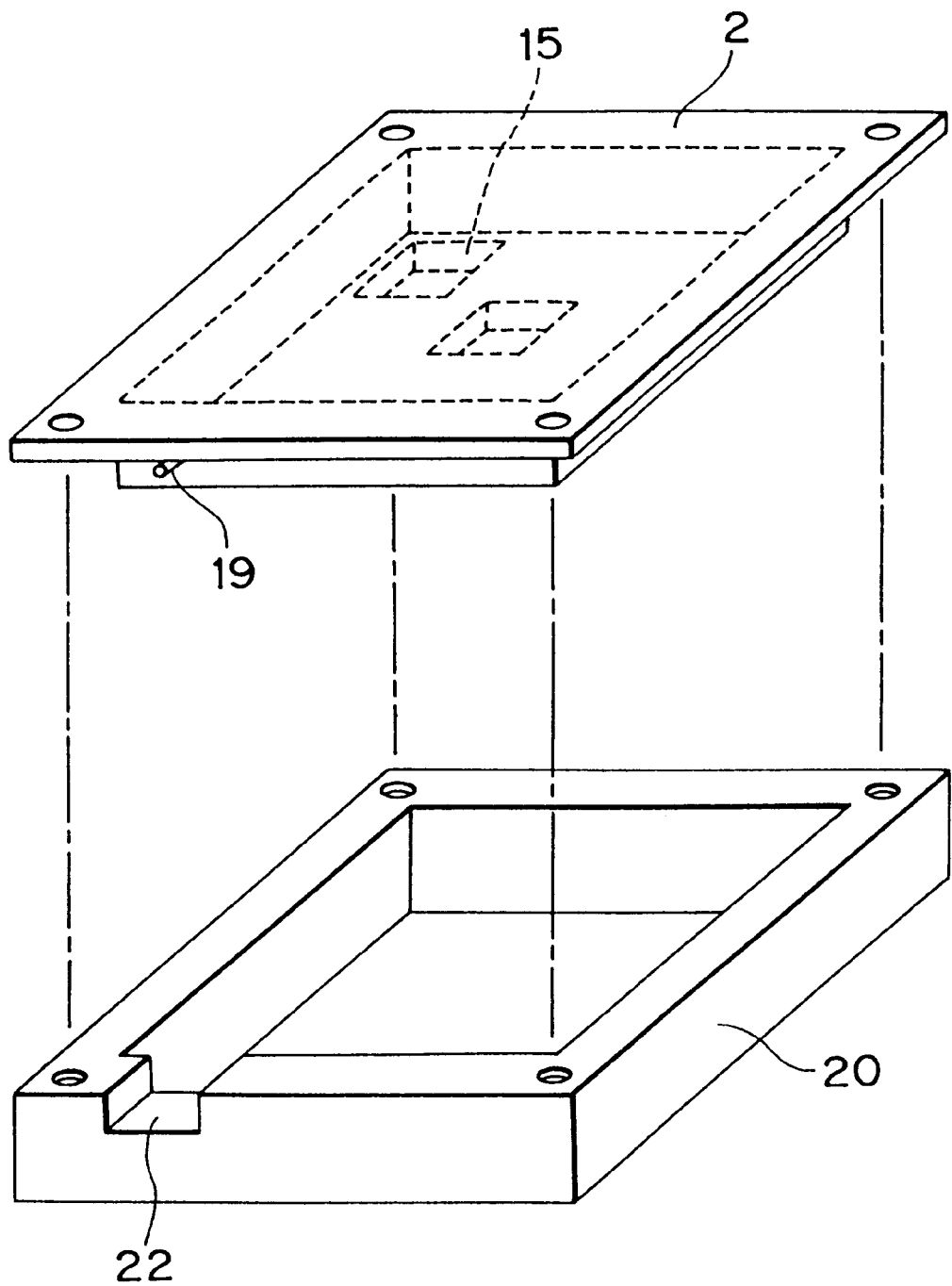
FIG. 24 is a perspective view of a heat pipe, which explains a method of fixing the outer frame according to the present invention.

Moreover, when the container is fixed to the outer frame, a sealing tube needs to be fitted to the container with care. FIG. 24 explains this fixing method. A container 2 is fitted with a sealing tube 19 which is a discharging port used for creating a vacuum by degassing the inside of the container 2 and then sealing the inside of the container after degassing. When the sealing tube 19 is broken during the heat pipe being carried or attached, or used, the working fluid abnormally changes phases.

Figure 25:
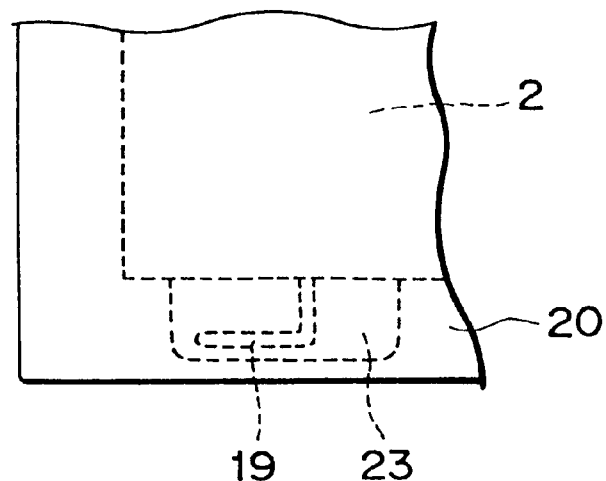
FIG. 25 is a plan view of the outer frame according to the present invention, which shows the relationship between the sealing tube and the outer frame.

In order to prevent breakage, it is preferable recommended to accommodate the sealing tube 19 in the outer frame so as not to protrude outside of the outer frame. In FIG. 24, the outer frame 20 is provided with a notch 22. After fixing, the sealing tube 19 is stored in the notch 22. Moreover, in FIG. 25, a recess 23 is provided on the outer frame 20, and the sealing tube 19 is bent and stored therein.

Figure 26:
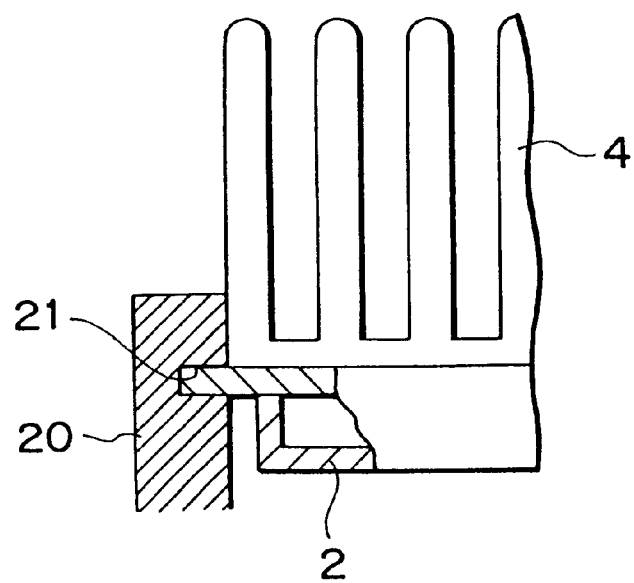
FIG. 26 is a sectional view of an incorporating portion, showing a case in which the outer frame according to the present invention is fitted into the container.

Methods of fixing the container 2 to the outer frame 20 includes not only screwing mentioned above but also spot-welding which is prefer to perform the fixing at a number of points. The most secure fixing method is to dispose a groove 21 into the outer frame 20 and then to fit an edge portion of the container 2 into this groove 21. A portion fitted with the edge portion is shown in FIG. 26. The edge portion of the container 2 is fitted into the groove 21.

The outer frame 20 is not limited to a particular material, it can be made of resin (ABS, PC, epoxy, etc.), and metal material such as aluminum material, copper material, and magnesium material. In the case of using resin, its surface is plated and then material with electric conductive property is applied, thereby providing the electromagnetic shielding effect as is the case with the metal material. This effect is convenient for the case in which the body to be cooled comprises electric parts.

EXAMPLES

A cooling device was formed by attaching fins to the heat pipe with the container in which the porous metal body was arranged and the mesh was disposed along the inner wall, shown in FIG. 19. The effect obtained when five semiconductors were cooled by the cooling device, was examined.

Figure 27A:
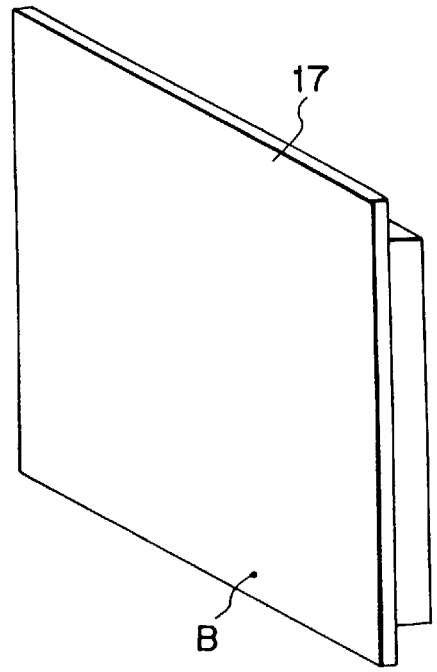
FIG. 27(a) is one as viewed from a heat radiating surface.
Figure 27B:
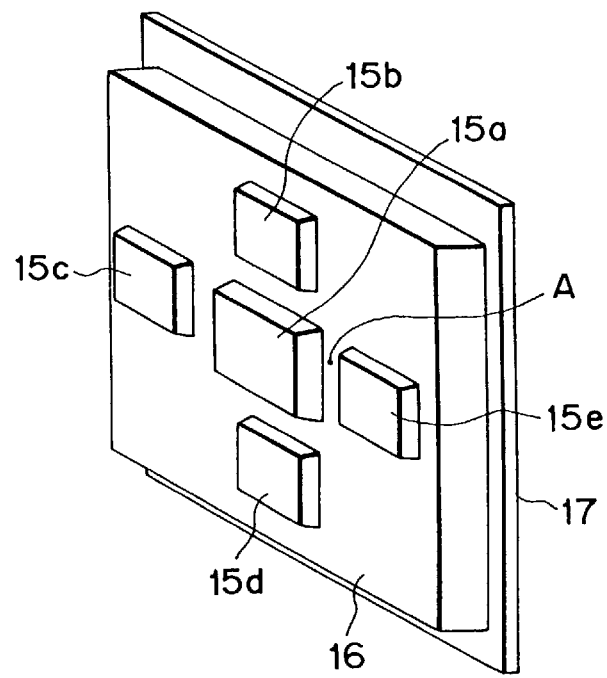
FIG. 27(b) is one as viewed from a heat absorbing surface.

In FIG. 19, the porous metal body 13 is shaped like a flat plate. This container is shown in a perspective view in FIG. 27, in which FIG. 27(a) illustrates the heat radiating surface 17, and FIG. 27(b) illustrates the heat absorbing surface 16.

There are disposed five protrusion portions 15, including the protrusion portion 15a, the protrusion portion 15b, the protrusion portion 15c, the protrusion portion 15d, and the protrusion portion 15e. The protrusion portion 15a is in close contact with a semiconductor having 100 W, and the protrusion portion 15b, the protrusion portion 15c, the protrusion portion 15d, and the protrusion portion 15e are in close contact with semiconductors having 5 W. The cooling effect was evaluated by measuring the temperatures of the heat radiating surface 17 and the heat absorbing surface 16 and then obtaining thermal resistance based on the measured temperature difference. The measuring points are designated by reference symbols A and B.

Pure water was used as the working fluid, the amount of which is 30% of the volume of the container. The heat transferring metal columns, formed of an oxygen free copper-made solid prism, are arranged on all the corners then joined to the heat absorbing surface and the heat radiating surface by silver-blazing, respectively. The mesh disposed along the inner walls are made of oxygen free copper.

The examination was carried out for three examples of the embodiments in which the material of the heat transferring metal column is changed, and two comparative examples, one for the heat transferring metal column not being provided and the other for the porous metal body as the first wick of the conventional heat pipe being provided instead of the heat transferring metal column.

The heat transferring metal column used in Example 1 is a cell-like porous copper body made from sintered copper powder, which is 0.3 mm in average pore size, 80% in void ratio, 2.5 mm in thickness. The heat transferring metal column used in Example 2 is a metal mesh molded 20 body, formed by putting 15 layers of mesh of 80 μm in fiber diameter and #120 (i.e., 120 mesh/inch) in mesh one over another, and folding them down to about 2.5 mm in thickness. The heat transferring metal column used in Example 3 is a pure copper-made unwoven which is 70 μm in fiber diameter, 60% in void ratio, and 2.5 mm in thickness.

Figure 28A:
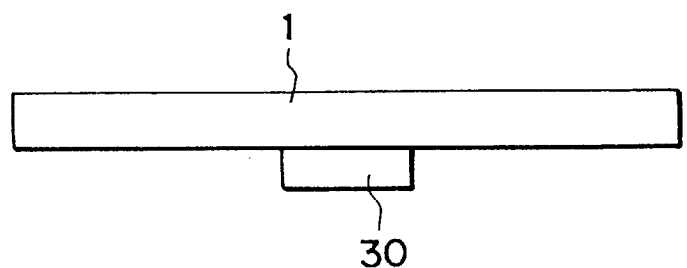
FIG. 28(a) is for the angle 0°.
Figure 28B:
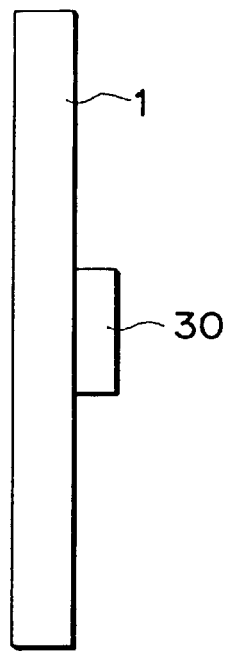
FIG. 28(b) is for the angle 90°.
Figure 28C:
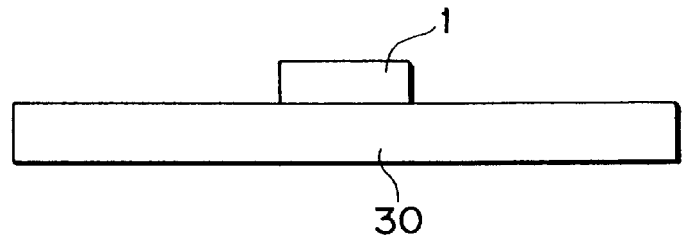
FIG. 28(c) is for the angle 180°.
Figure 29:
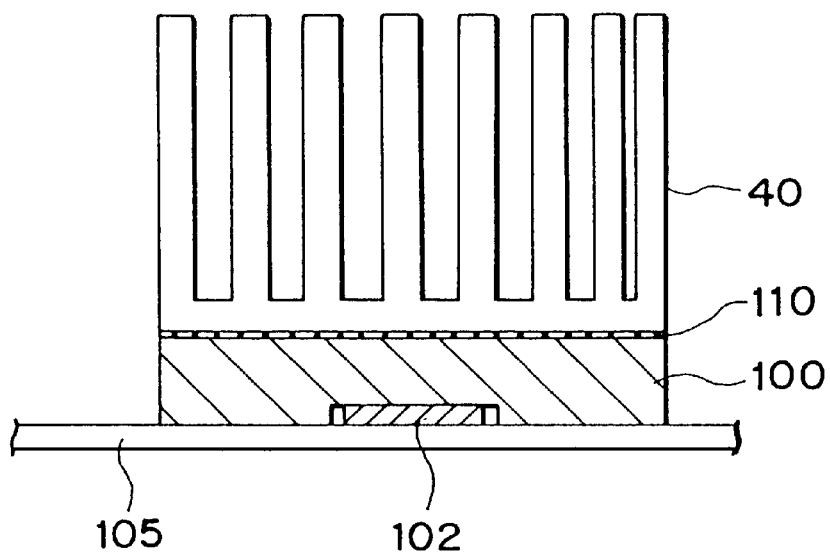
FIG. 29 is a sectional view of a spreader provided with a conventional heat transferring metal body.
Figure 30:
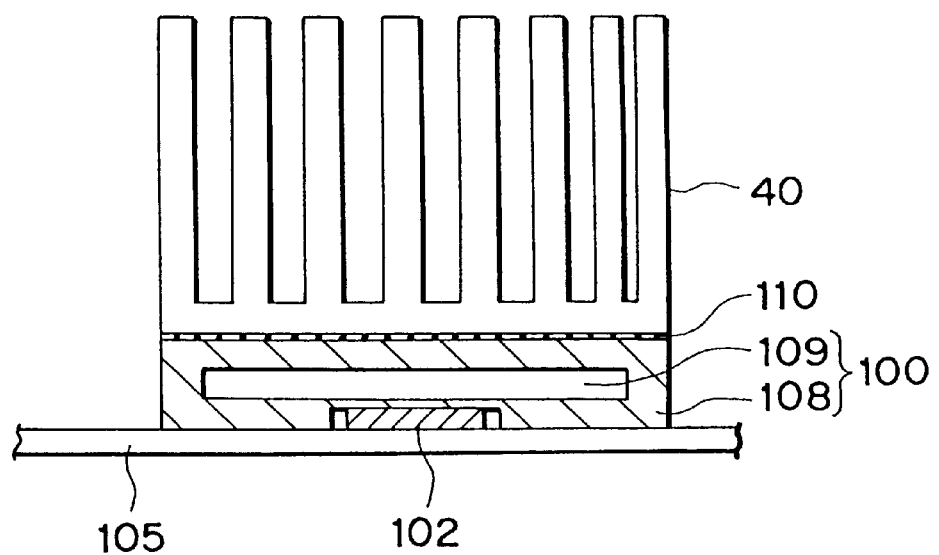
FIG. 30 is a sectional view of a spreader in which a heat pipe is incorporated with a conventional heat transferring body.
Figure 31A:
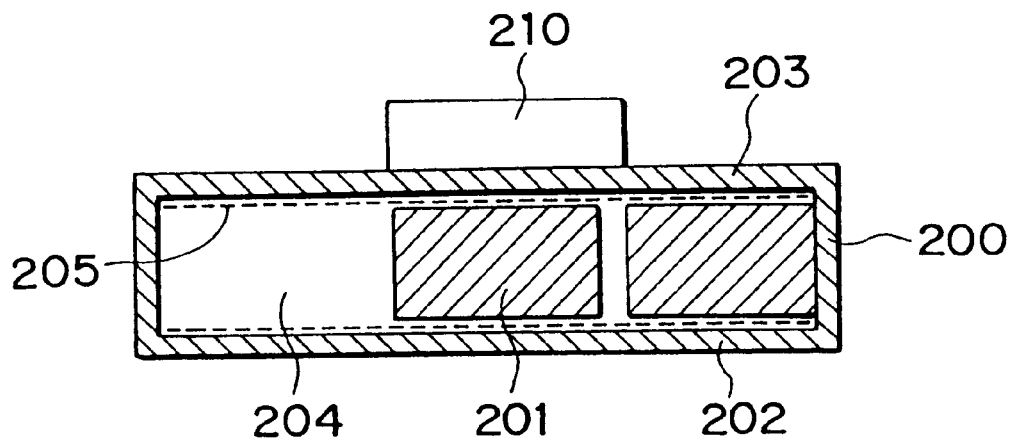
FIG. 31(a) is a longitudinal sectional view of a container provided with a conventional porous metal body.
Figure 31B:
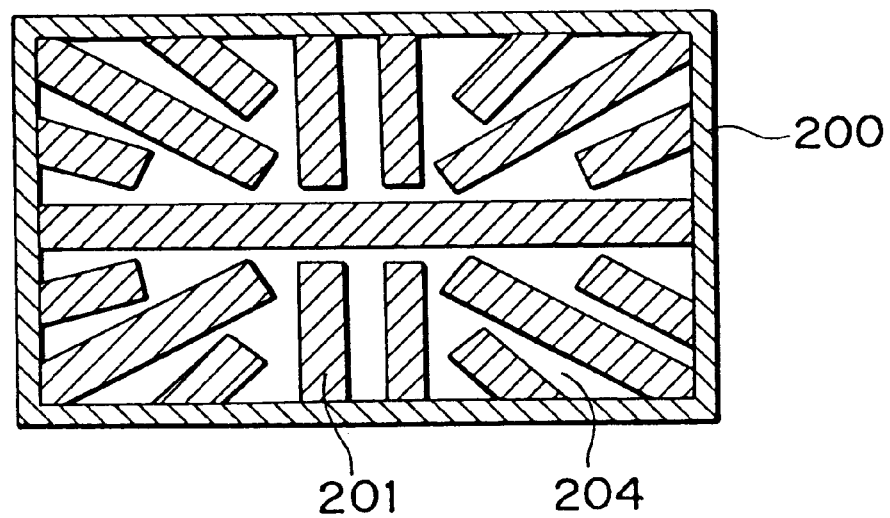
FIG. 31(b) is a cross sectional view of the container.

As to the above five examples, the temperatures were measured at the angles of 0°, 90°, 180° at the base provided with the body to be cooled, and hence from the measured values were derived the heat transferring resistance. The positional relationship between the heat pipe and the body to be cooled when the angle is changed is shown in FIG. 28, in which FIG. 28(a) is for the position of the angle 0° in which the body to be cooled 30 is located below the heat pipe 1, and FIG. 28(b) is for the position of the angle 90° in which the body to be cooled 30 is located on the lateral side of the heat pipe 1; and FIG. 28(c) is for the position of the angle 180°, turned upside down as compared with the case of the angle 0°, where the body to be cooled 30 is located above the heat pipe 1.

The thermal resistance is designated by R, and the temperatures at the above locations by TA, TB, respectively, the R value was obtained by dividing the difference between the TA value and the TB value by an electric power consumption W. That is, the thermal resistance R was calculated by the use of the following equation (1):

$$R=(TA-TB)/W \qquad (1)$$

The results of the examination are shown in Table 1.

In the Examples of the present invention, the thermal resistance is less than 0.04 (K/W) for all the positions because the porous metal body is arranged so as to contact the heat transferring metal column. Contrary to this, in comparative example 1, the thermal resistance is small for the angles 0° and 180° because the heat transferring metal column is provided; however, the thermal resistance is large for the angle 90°. In the comparative example 2, the thermal resistance is greater than 0.1 (K/W) for all the positions because the heat transferring metal column is provided instead of the porous metal body, thereby causing the heat to be dispersed to the working fluid weakening the action of transferring the heat.

In light of the above the cooling device according to the present invention is provided with the heat pipe, in which the heat pipe comprises the plate-like container for containing the working fluid, and the heat transferring metal column, having a large surface and disposed in the heat absorbing wall of the container and contacting the body to be cooled, wherein the heat transferring metal column disperses the heat to the working fluid, which prevents the vaporized working fluid in the gas phase reaching an excessively high temperature.

Further, the working fluid in the liquid phase is transferred to the heat transferring metal column and the heat absorbing wall by the use of the capillary construction of mesh and the porous metal body disposed in the container, which causes the working fluid to be returned smoothly even when the heat pipe is in the inclined position.

Therefore, immediately after receiving the latent heat, the working fluid is moved toward the heat radiating wall to transfer the latent heat to the heat radiating wall, thereby causing the effective circulation of the heat to be repeated. Also, to cool a plurality of the bodies to be cooled by one cooling device, the protrusion portions is abutted to the respective bodies to be cooled and disposed on the heat absorbing surface of the container, and to prevent the container from being deformed, the support is disposed inside of the container and the outer frame is disposed at the outer periphery of the container. This reinforcement attaches the outer frame to the base on which the bodies to be cooled are arranged, thereby causing the protrusion portions to be in close contact with all the bodies to be cooled by a suitable pressure, which enables the work of attaching the components to be rapidly and surely performed. In this manner, the present invention has a marked effect of realizing the simple cooling device which is capable of performing the efficient cooling effect.

TABLE 1

Thermal Resistance

|  | Thermal resistance R (K/W) | | |
| --- | --- | --- | --- |
|  | Angle 0° | Angle 90° | Angle 180° |
| Example 1 | 0.02 | 0.03 | 0.025 |
| Example 2 | 0.02 | 0.04 | 0.035 |
| Example 3 | 0.02 | 0.035 | 0.03 |
| Comparative example 1 | 0.02 | 0.18 | 0.03 |
| Comparative example 2 | 0.11 | 0.12 | 0.12 |

We claim:

1. A cooling device with a heat pipe comprising: a plate-like container made of heat transferring metal for containing a working fluid and having a heat absorbing wall and a heat radiating wall, wherein said heat absorbing wall has a large heat absorbing surface corresponding to a plurality of bodies to be cooled; and said heat absorbing wall having a plurality of press-formed protrusion portions, each of said protrusion portions having a predetermined height, and being abutted to said bodies to be cooled.

2. A cooling device with a heat pipe according to claim 1, wherein a support is disposed inside of said container.

3. A cooling device with a heat pipe, according to claim 2, wherein said support is formed by subjecting one of said heat absorbing wall and said heat radiating wall of said container to embossing toward the opposed wall.

4. A cooling device with a heat pipe according to claim 1, wherein mesh is disposed along an inner surface of said heat absorbing wall of said container.

5. A cooling device with a heat pipe according to claim 1, wherein mesh is disposed along an inner surface of said heat absorbing wall and an inner surface of said heat radiating wall of said container.

6. A cooling device with a heat pipe according to claim 1, wherein mesh is disposed inside of at least one of said protrusion portions of said container so as to face said heat radiating wall.

7. A cooling device with a heat pipe according to claim 1, wherein a heat transferring metal column is disposed inside of at least one of said protrusion portions of said container so as to face said heat radiating wall.

8. A cooling device with a heat pipe according to claim 7, wherein said heat transferring metal column comprises a waveform fin.

9. A cooling device with a heat pipe according to claim 1, wherein a block is disposed inside of at least one of said protrusion portions of said container.

10. A cooling device with a heat pipe according to claim 9, wherein said block contacts said heat absorbing wall through a metal mesh.

11. A cooling device with a heat pipe according to claim 9, wherein protrusions are disposed on a surface of said block contacting said heat absorbing wall.

12. A cooling device with a heat pipe according to claim 7, wherein a porous metal body is disposed so as to contact said heat transferring column.

13. A cooling device with a heat pipe according to claim 1, wherein an outer frame is fixed to an outer periphery portion of said container, said outer frame serves as a portion attached to a base of said body to be cooled.

14. A cooling device with a heat pipe according to claim 13, wherein an attachment construction of said outer frame with said base of said body to be cooled is of a screwing construction.

15. A cooling device with a heat pipe according to claim 13, wherein a groove is disposed on said outer frame, and an edge portion of said container is fitted to said groove and fixed to said outer frame.

16. A cooling device with a heat pipe according to claim 12, wherein said outer frame is electric conductive.

17. A cooling device provided with a heat pipe, wherein
(a) said heat pipe comprises a plate-like container made of a heat transferring metal for containing working fluid, having a heat absorbing wall and a heat radiating wall;
(b) a heat transferring metal column is disposed between said heat absorbing wall and said heat radiating wall; and
(c) a contact area of said heat absorbing wall with said heat transferring metal column covers an area of a body to be cooled which is to be contacted with said heat absorbing wall.

18. A cooling device provided with a heat pipe, as claimed in claim 17, wherein said body to be cooled is contacted with said heat absorbing wall at position where said heat transferring metal column is disposed on said heat absorbing wall.

19. A cooling device provided with a heat pipe, as claimed in claim 17, wherein said heat absorbing wall is provided with a plurality of protrusion portions at the portion where said heat transferring metal column is disposed and a body to be cooled is contacted to a corresponding area of said heat absorbing wall where said protrusion portion is disposed.

20. A cooling device provided with a heat pipe, as claimed in claim 17, wherein an area of said heat absorbing wall which a body to be cooled is contacted with is covered by said heat absorbing wall where said heat transferring metal column is disposed.

* * * * *